US007230368B2

(12) United States Patent
Lukacs et al.

(10) Patent No.: US 7,230,368 B2
(45) Date of Patent: Jun. 12, 2007

(54) ARRAYED ULTRASONIC TRANSDUCER

(75) Inventors: Marc Lukacs, Toronto (CA); F. Stuart Foster, Toronto (CA)

(73) Assignee: VisualSonics Inc., Toronto, Ontario ( * ) Notice: Subject to any disclaimer, the term of this patent is extended or adjusted under 35 U.S.C. 154(b) by 0 days.

(21) Appl. No.: 11/109,986

(22) Filed: Apr. 20, 2005

(65) Prior Publication Data

US 2005/0272183 A1 Dec. 8, 2005

Related U.S. Application Data

(60) Provisional application No. 60/563,784, filed on Apr. 20, 2004.

(51) Int. Cl.
*H01L 41/083* (2006.01)

(52) U.S. Cl. ....................................... 310/335; 310/334

(58) Field of Classification Search ................ 310/334, 310/335

See application file for complete search history.

(56) References Cited

U.S. PATENT DOCUMENTS 3,922,572 A 11/1975 Cook et al.
4,217,684 A 8/1980 Brisken et al.

(Continued)

FOREIGN PATENT DOCUMENTS

| | | | |
|---|---|---|---|
| DE | 4226865 | A1 | 3/1994 |
| EP | 0629992 | A2 | 12/1994 |
| EP | 0629994 | A2 | 12/1994 |
| EP | 0779108 | A2 | 6/1997 |
| EP | 1227525 | A2 | 7/2002 |
| EP | 1318551 | A2 | 6/2003 |
| FR | 2828056 | A1 | 1/2003 |
| JP | 2004080193 | | 3/2004 |
| WO | WO 97/17018 | A1 | 5/1997 |
| WO | WO 02/43593 | A1 | 6/2002 |
| WO | WO 2004/007098 | A1 | 1/2004 |

(Continued)

OTHER PUBLICATIONS

Bridal et al., Milestones on the Road to Higher Resolution, Quantitative, and Functional Ultrasonic Imaging; *Proceedings of the IEEE*, vol. 91:10, 1543-1561 (2003).

(Continued)

*Primary Examiner*—Darren Schuberg
*Assistant Examiner*—Derek Rosenau
(74) *Attorney, Agent, or Firm*—Needle & Rosenberg, P.C.

(57) ABSTRACT

An ultrasonic transducer comprises a stack having a first face, an opposed second face and a longitudinal axis extending therebetween. The stack comprises a plurality of layers, each layer having a top surface and an opposed bottom surface, wherein the plurality of layers of the stack comprises a piezoelectric layer and a dielectric layer. The dielectric layer is connected to the piezoelectric layer and defines an opening extending a second predetermined length in a direction substantially parallel to the axis of the stack. A plurality of first kerf slots are defined therein the stack, each first kerf slot extending a predetermined depth therein the stack and a first predetermined length in a direction substantially parallel to the axis. The first predetermined length of each first kerf slot is at least as long as the second predetermined length of the opening defined by the dielectric layer and is shorter than the longitudinal distance between the first face and the opposed second face of the stack in a lengthwise direction substantially parallel to the axis.

63 Claims, 16 Drawing Sheets

U.S. PATENT DOCUMENTS

| | | | | |
|---|---|---|---|---|
| 4,385,255 | A * | 5/1983 | Yamaguchi et al. | 310/335 |
| 4,543,829 | A | 10/1985 | Lerch | |
| 4,841,977 | A | 6/1989 | Griffith et al. | |
| 5,045,746 | A | 9/1991 | Wersing et al. | |
| 5,160,870 | A | 11/1992 | Carson et al. | |
| 5,186,177 | A | 2/1993 | O'Donnell et al. | |
| 5,329,496 | A | 7/1994 | Smith | |
| 5,406,163 | A | 4/1995 | Carson et al. | |
| 5,445,155 | A | 8/1995 | Sieben | |
| 5,456,259 | A | 10/1995 | Barlow et al. | |
| 5,548,564 | A | 8/1996 | Smith | |
| 5,553,035 | A | 9/1996 | Seyed-Bolorforosh et al. | |
| 5,577,506 | A | 11/1996 | Dias | |
| 5,655,276 | A | 8/1997 | Pattanayak et al. | |
| 5,704,105 | A | 1/1998 | Venkaturamani et al. | |
| 5,744,898 | A | 4/1998 | Smith et al. | |
| 5,834,880 | A | 11/1998 | Venkataramani et al. | |
| 5,938,612 | A | 8/1999 | Kline-Schoder et al. | |
| 5,938,615 | A | 8/1999 | Eberle et al. | |
| 5,976,090 | A | 11/1999 | Hanafy et al. | |
| 5,977,691 | A | 11/1999 | Stephens et al. | |
| 6,183,578 | B1 | 2/2001 | Ritter et al. | |
| 6,236,144 | B1 | 5/2001 | Millar et al. | |
| 6,238,481 | B1 | 5/2001 | Yamashita et al. | |
| 6,437,487 | B1 * | 8/2002 | Mohr et al. | 310/365 |
| 6,492,762 | B1 | 12/2002 | Pant et al. | |
| 6,547,731 | B1 | 4/2003 | Coleman et al. | |
| 6,608,371 | B2 * | 8/2003 | Kurashima et al. | 257/686 |
| 6,656,124 | B2 | 12/2003 | Flesch et al. | |
| 6,664,717 | B1 | 12/2003 | Mohr, III et al. | |
| 6,759,791 | B2 | 7/2004 | Hatangadi et al. | |
| 6,761,688 | B1 | 7/2004 | Mohr, III et al. | |
| 6,784,600 | B2 | 8/2004 | Klee et al. | |
| 6,822,376 | B2 * | 11/2004 | Baumgartner | 310/365 |
| 2002/0050169 | A1 | 5/2002 | Ritter et al. | |
| 2002/0157472 | A1 | 10/2002 | Stephens et al. | |
| 2003/0009873 | A1 | 1/2003 | Hatangadi et al. | |
| 2003/0067249 | A1 | 4/2003 | Lockwood et al. | |
| 2003/0073906 | A1 | 4/2003 | Flesch et al. | |
| 2003/0187356 | A1 | 10/2003 | Wakabayashi et al. | |
| 2003/0189391 | A1 | 10/2003 | Shimizu | |
| 2003/0205947 | A1 | 11/2003 | Klee et al. | |
| 2004/0002656 | A1 | 1/2004 | Sheljaskow et al. | |
| 2004/0011134 | A1 | 1/2004 | Sato | |
| 2004/0040740 | A1 * | 3/2004 | Nakatani et al. | 174/256 |
| 2004/0236219 | A1 | 11/2004 | Liu et al. | |
| 2005/0039323 | A1 * | 2/2005 | Sheljaskow | 29/594 |
| 2005/0046030 | A1 | 3/2005 | Nakamura | |
| 2005/0099096 | A1 | 5/2005 | Baumgartner et al. | |
| 2005/0099097 | A1 | 5/2005 | Baumgartner et al. | |
| 2005/0156490 | A1 | 7/2005 | Shiraishi et al. | |
| 2005/0197574 | A1 | 9/2005 | Eberle et al. | |
| 2005/0272183 | A1 | 12/2005 | Lukacs et al. | |

OTHER PUBLICATIONS

Brown A. et al., Quantitation of Hemodynamic Function during Developmental Vascular Regression in the Mouse Eye; *Investigative Opthalmology & Visual Science*, vol. 46:2231-2237 (2005).

Brown A. et al.,In Vivo Assessment of Postnatal Murine Ocular Development by Ultrasound Biomicroscopy; *Current Eye Research*, vol. 30, 45-51 (2005).

Brown J. et al., Performance of a 50 MHz Annular Array Based Imaging System; *IEEE International Ultrasonics, Ferroelectrics and Frequency Control Joint 50th Anniversary Conference* , 760-763 (2004).

Cannata et al., Development of a High Frequency (35 MHz) Linear Ultrasonic Array using 2-2 Composite Elements; *IEEE International Ultrasonics, Ferroelectrics and Frequency Control Joint 50th Anniversary Conference*, 894-897 (2004).

Chang-hong Hu et al., FPGA Based Digital High Frequency Beamformers for Arrays; *IEEE International Ultrasonics, Ferroelectrics and Frequency Control Joint 50th Anniversary Conference*, 1347-1350 (2004).

Ergun et al., Broadband Capacitive Micromachined Ultrasonic Transducers Ranging from 10kHz to 60 MHz for Imaging Arrays and More; *Proceedings IEEE Ultrasonics Symposium*, 1039-1043 (2002).

Farlow et al., Micromachining of a Piezocomposite Transducer Using a Copper Vapor Laser; *IEEE Transactions on Ultrasonics, Ferroelectrics and Frequency Control*, 48:3 639-640 (2001).

Goertz et al., High Frequency Nonlinear B-Scan Imaging of Microbubble Contrast Agents; *IEEE Transactions on Ultrasonics, Ferroelectrics and Frequency Control*, 52:1 65-79 (2005).

Guess et al., Cross-Talk Paths in Array Transducers; Proceedings IEEE Ultrasonics Symposium 1279-1282 (1995).

Jensen, JA, Field: A Program for Simulating Ultrasound Systems; *Medical & Biological Engineering & Computing* vol. 34:351-354 (1996).

Lerch, R., Simulation of Piezoelectric Devices by Two- and Three-Dimensional Finite Elements; *IEEE Transactions on Ultrasonics, Ferroelectrics and Frequency Control*, vol. 37 233-247 (1990).

Liu et al., Interdigital Pair Bonding for High Frequency (20-50 MHz) Ultrasonic Composite Transducers; *IEEE Transactions on Ultrasonics, Ferroelectrics and Frequency Control*, vol. 48:1 299-306 (2001).

McKeighen, R., Design Guidelines for Medical Ultrasonic Arrays; *SPIE International Symposium on Medical Imaging*; vol. 3341:2-18 (1998).

Michau et al., Piezocomposite 30 MHz linear array for medical imaging: design challenges and performances evaluation of a 128 elements array; *IEEE International Ultrasonics, Ferroelectrics and Frequency Control Joint 50th Anniversary Conference*, 898-901 (2004).

Oralkan et al., Capacitive Micromachined Ultrasonic Transducers: Next-Generation Arrays for Acoustic Imaging?; *IEEE Transactions on Ultrasonics, Ferroelectrics and Frequency Control*, vol. 49:11 1596-1610 (2002).

Oralkan et al., High-Frequency CMUT Arrays for High-Resolution Medical Imaging; *IEEE International Ultrasonics, Ferroelectrics and Frequency Control Joint 50th Anniversary Conference*, 399-402 (2004).

Powell et al., Incremental "Model-Built-Test" Validation Exercise for a 1-D Biomedical *Ultrasonic Imaging Array; Proceedings IEEE Ultrasonics Symposium*, 1669-1674 (1997).

Qi, W. and Cao, W., Finite Element Study on 1-D Array Transducer Design; *IEEE Transactions on Ultrasonics, Ferroelectrics and Frequency Control*, vol. 47 4:949-955 (2000).

Ritter et al., A 30-MHz Piezo-Composite Ultrasound Array for Medical Imaging Applications; *IEEE Transactions on Ultrasonics, Ferroelectrics and Frequency Control*, 49:2 217-230 (2002).

Roh et al., Finite Element Analysis on Reduction of the Cross Talk in Ultrasonic Transducers; Smart Structures and Materials, Proceedings of SPIE, vol. 4693:214-221 (2002).

Sherrit et al., Field dependence of the complex piezoelectric, dielectric, and elastic constants of Motorola PZT 3203 HD ceramic; Proceedings of SPIE Conference of Smart Materials Technologies, SPIE vol. 3040:99-109 (1997).

Snook et al., Design of 50 MHz Annular Array Using Fine-Grain Lead Titanate; Medical Imaging, Proceedings of SPIE, vol. 4687:91-98 (2002).

Tutwiler et al., Design of a Test System to Characterize Very High-Frequency Ultrasound Transducer Arrays; *SPIE Conference on Ultrasonic Transducer Engineering*, vol. 3664:182-193 (1999).

Villanueva et al., Microbubbles Targeted to Intercellular Adhesion Molecule-1 Bind to Activated Coronary Artery Endothelial Cells; *Circulation*, 98:1-5 (1998.

Wang et al., Passive Materials for High Frequency Ultrasound Transducers; *Ultrasonic Transducer Engineering, SPIE*, vol. 3664:35-42 (1999).

Lukacs, et al., Single Element and Linear Array Transducer Design for Ultrasound Biomicroscopy, SPIE, vol. 3341, pp. 272-282, 1998.

Lukacs, et al., Single Element and Linear Array PZT Ultrasound Biomicroscopy Transducers, IEEE Ultrasonic Symposium, pp. 1709-1712, 1997.

Lukacs, et al., Laser Micromachined High Frequency Ultrasonic Arrays, IEEE Ultrasonic Symposium, pp. 1209-1212, 1998.

Herman, et al., Advanced-laser Processing of Photonic and Microelectronic Components at Photonics Research Ontario, SPIE Conference on Laser Applications in Microelectronic and Optoelectronic Manufacturing IV, pp. 240-250, 1999.

Lukacs, et al., Single Element and Linear Array High Frequency Ultrasonic Transducers Using PZT Sol Gel Composites, Queen's University, pp. 1-165, 1999, Kingston, Ontario, Canada.

* cited by examiner

ARRAYED ULTRASONIC TRANSDUCER

CROSS-REFERENCE TO RELATED APPLICATIONS

This application claims the benefit of U.S. Provisional Application No. 60/563,784, filed on Apr. 20, 2004, which is herein incorporated by reference in its entirety.

BACKGROUND OF THE INVENTION

High-Frequency ultrasonic transducers, made from piezoelectric materials, are used in medicine to resolve small tissue features in the skin and eye and in intravascular imaging applications. High-frequency ultrasonic transducers are also used for imaging structures and fluid flow in small or laboratory animals. The simplest ultrasound imaging system employs a fixed-focused single-element transducer that is mechanically scanned to capture a 2D-depth image. Linear-array transducers are more attractive, however, and offer features such as variable focus, variable beam steering, and permit more advanced image construction algorithms and increased frame rates.

Although linear array transducers have many advantages, conventional linear-array transducer fabrication requires complex procedures. Moreover, at high-frequency, i.e., at or about 20 MHz or above, the piezoelectric structures of an array must be smaller, thinner and more delicate than those of low frequency array piezoelectrics. For at least these reasons, conventional dice and fill methods of array production using a dicing saw, and more recent dicing saw methods such as interdigital pair bonding, have many disadvantages and have been unsatisfactory in the production of high-frequency linear array transducers.

SUMMARY OF THE INVENTION

In one aspect, an ultrasonic transducer of the present invention comprises a stack having a first face, an opposed second face and a longitudinal axis extending therebetween. The stack comprises a plurality of layers, each layer having a top surface and an opposed bottom surface. In one aspect, the plurality of layers of the stack comprises a piezoelectric layer that is connected to a dielectric layer. A plurality of kerf slots are defined therein the stack, each kerf slot extending a predetermined depth therein the stack and a first predetermined length in a direction substantially parallel to the axis. In another aspect, the dielectric layer defines an opening extending a second predetermined length in a direction that is substantially parallel to the axis of the stack. In an exemplified aspect, the first predetermined length of each kerf slot is at least as long as the second predetermined length of the opening defined by the dielectric layer. Additionally, the first predetermined length is shorter than the longitudinal distance between the first face and the opposed second face of the stack in a lengthwise direction substantially parallel to the longitudinal axis.

BRIEF DESCRIPTION OF THE DRAWINGS

The accompanying drawings, which are incorporated in and constitute a part of this specification, illustrate several aspects described below and together with the description, serve to explain the principles of the invention. Like numbers represent the same elements throughout the figures.

DETAILED DESCRIPTION OF THE INVENTION

Figure 1:
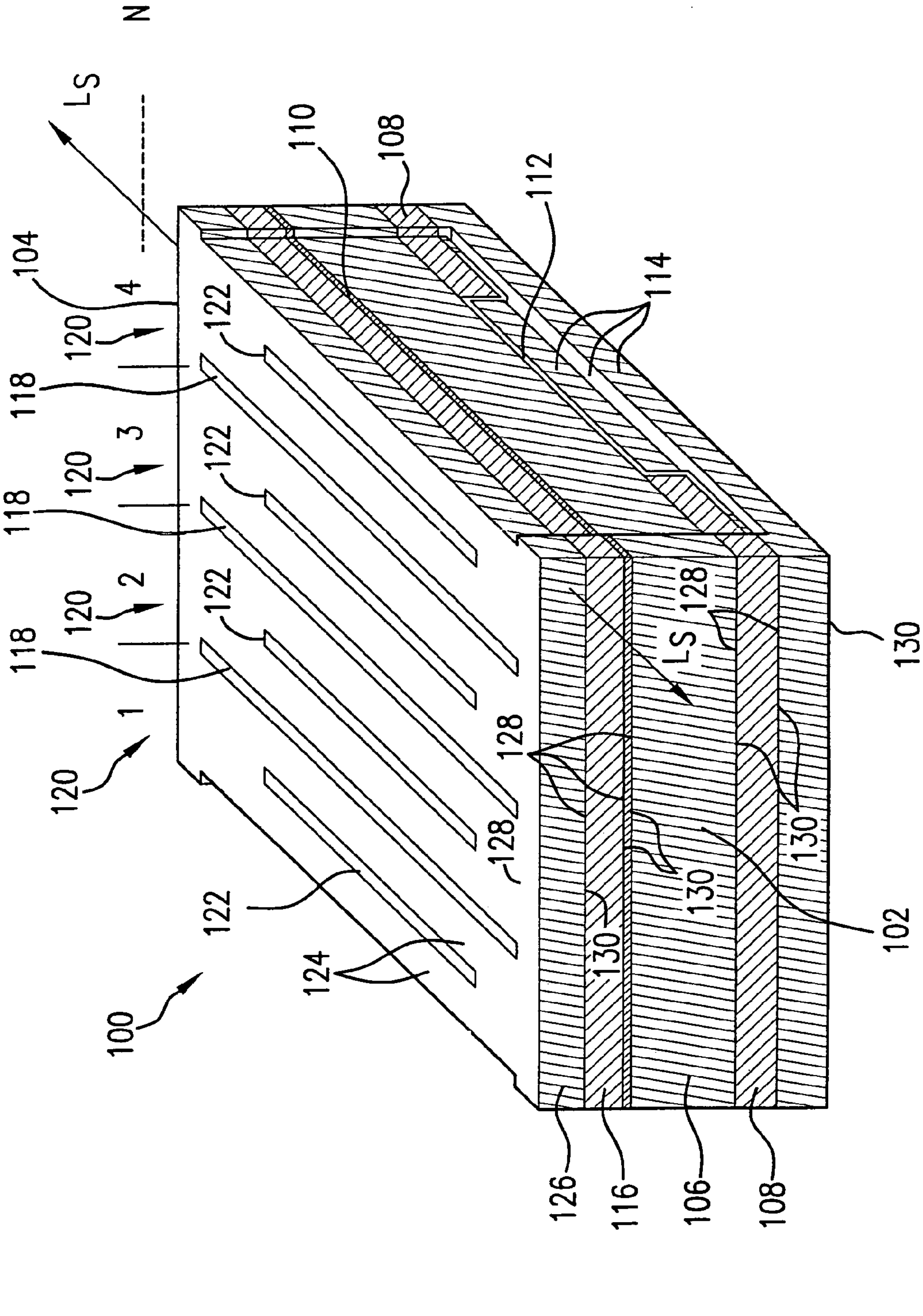
FIG. 1 is a perspective view of an embodiment of an arrayed ultrasonic transducer of the invention showing a plurality of array elements.
Figure 2:
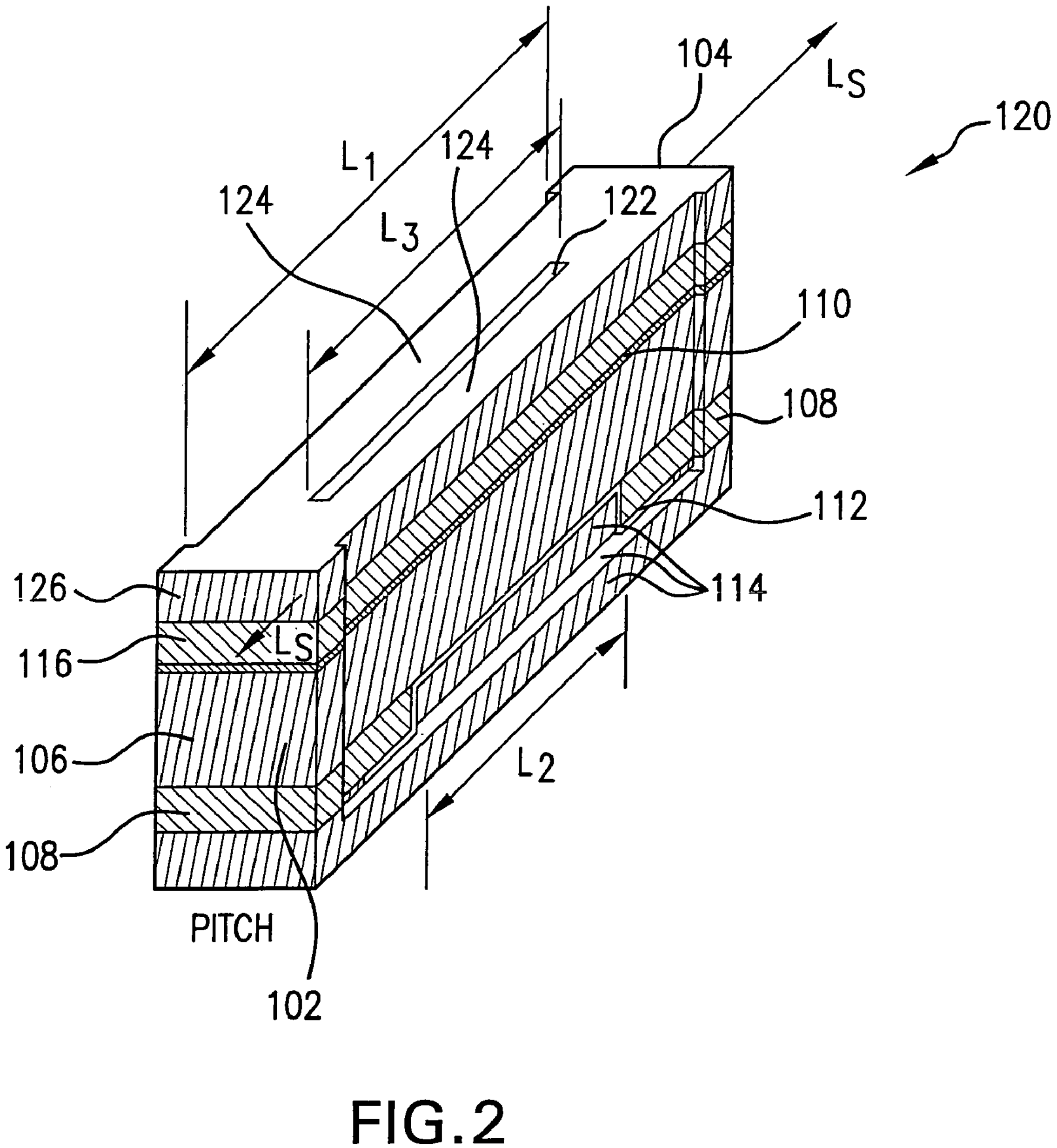
FIG. 2 is a perspective view of an array element of the plurality of array elements of the arrayed ultrasonic transducer of FIG. 1.
Figure 3:
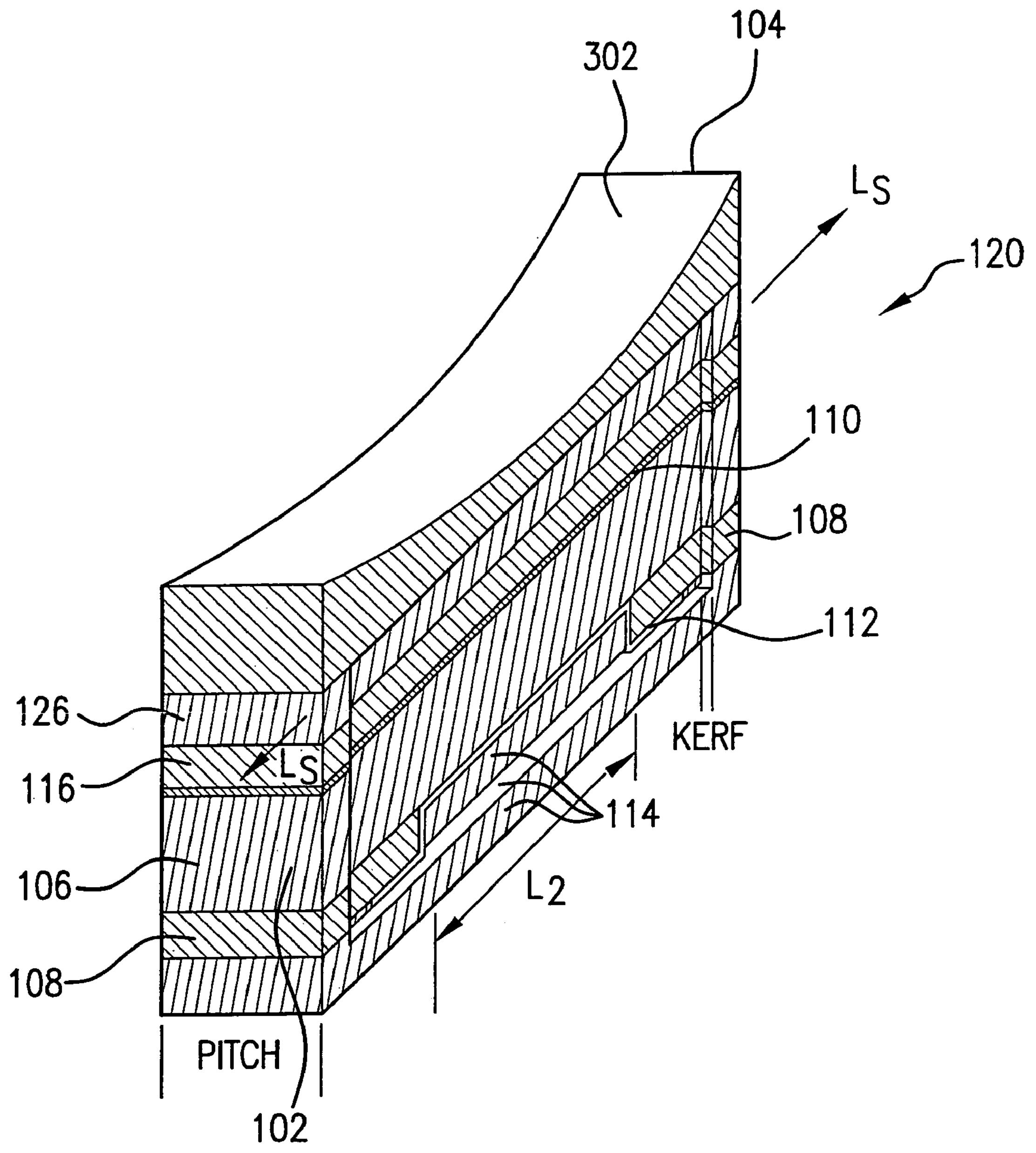
FIG. 3 is a perspective view showing a lens mounted thereon the array element of FIG. 2.
Figure 4:
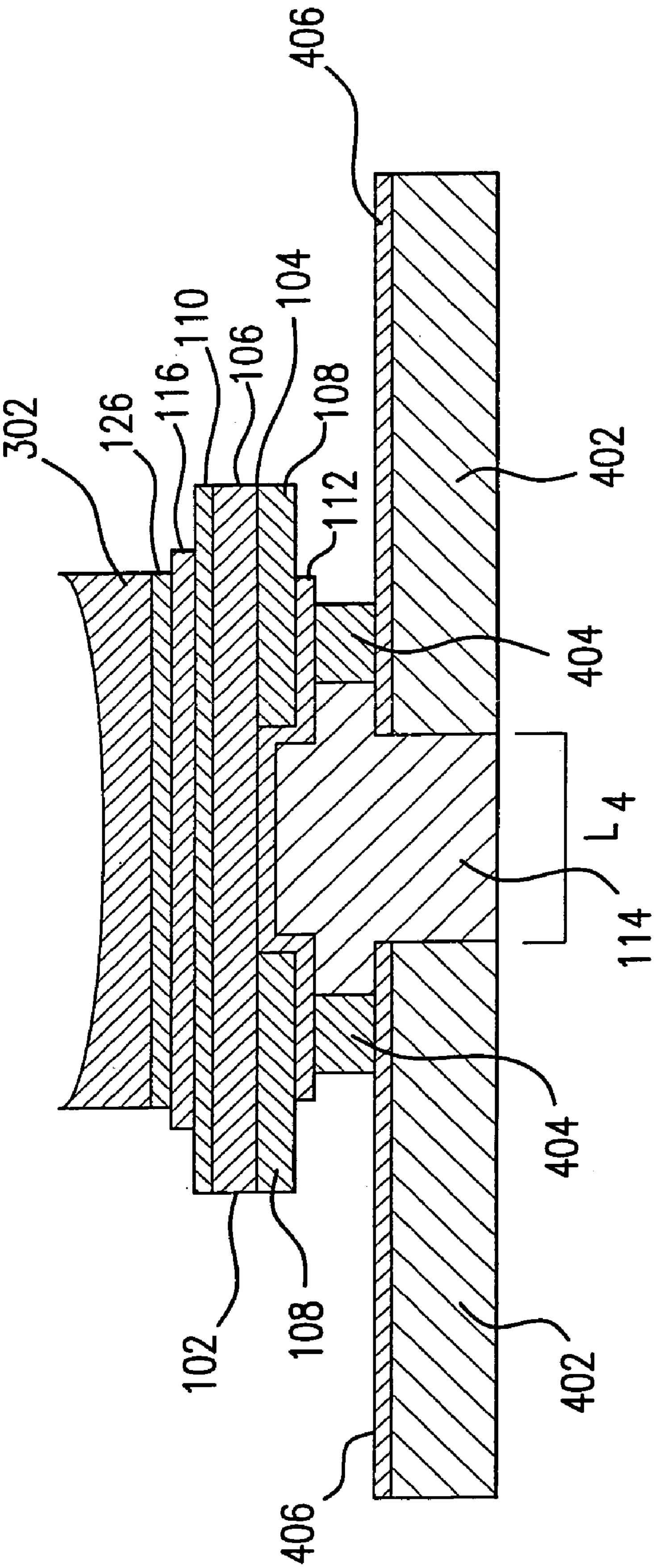
FIG. 4 is a cross-sectional view of one embodiment of an arrayed ultrasonic transducer of the present invention.
Figure 5:
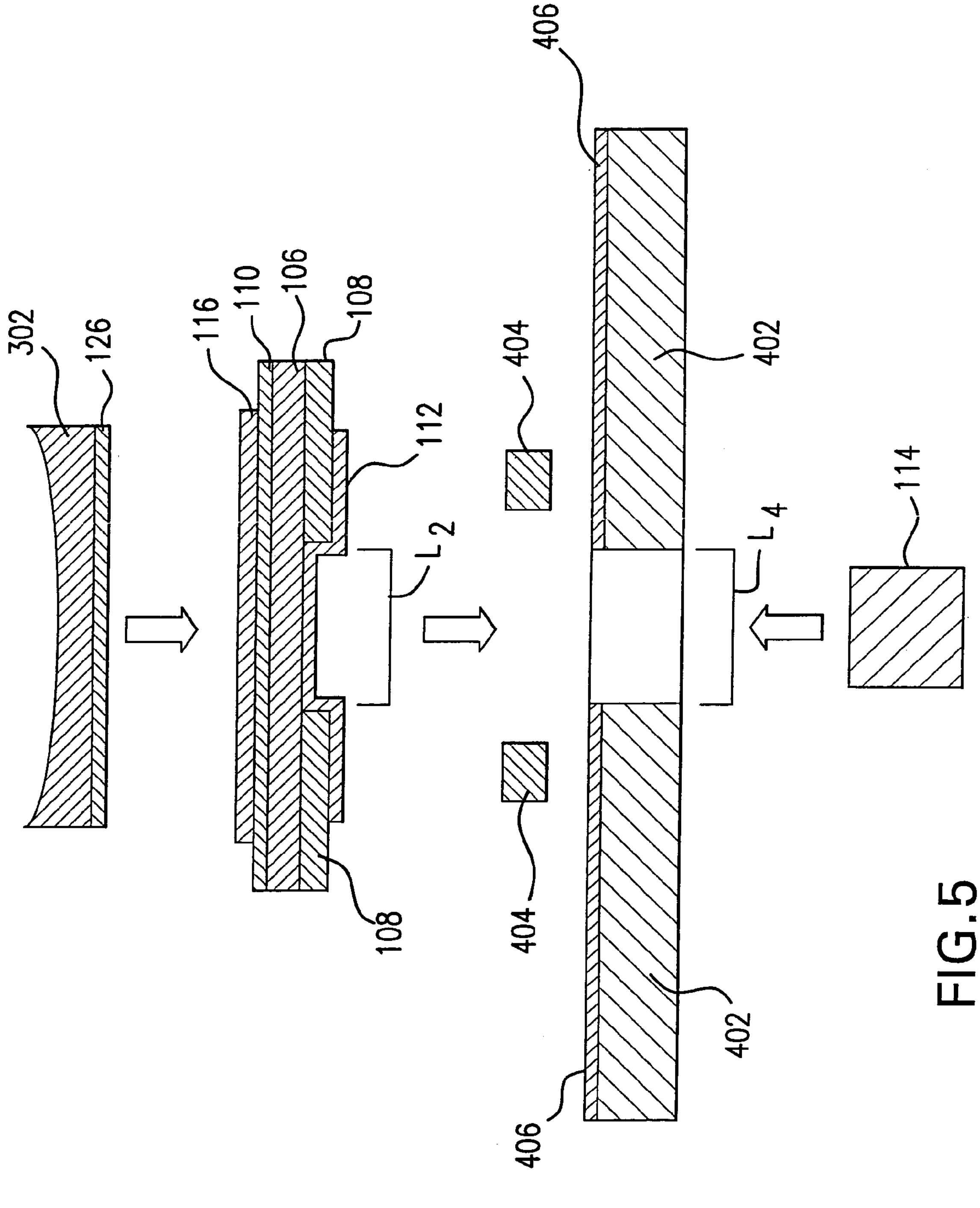
FIG. 5 is an exploded cross-sectional view of the embodiment shown in FIG. 4.
Figure 6:
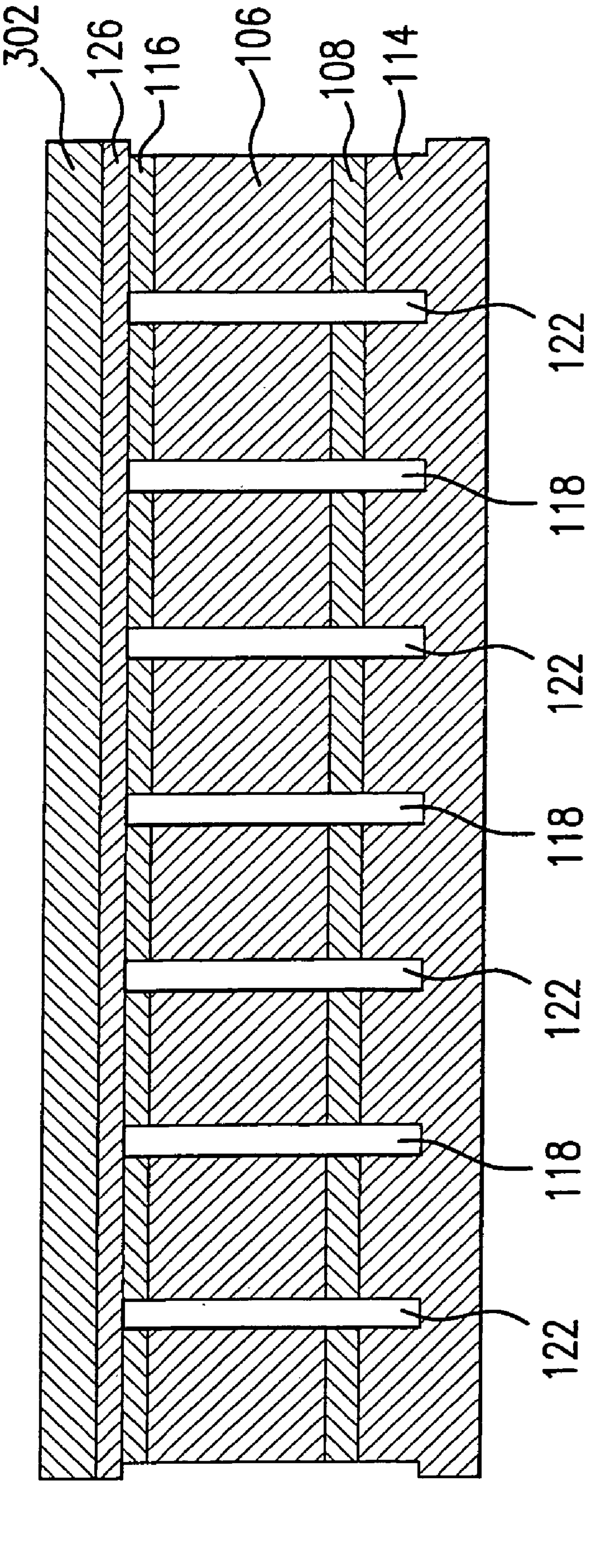
FIG. 6 is an exemplary partial cross-sectional view of the arrayed ultrasonic transducer of FIG. 1 taken transverse to the longitudinal axis Ls of the arrayed ultrasonic transducer, showing a plurality of first and second kerf slots extending through a first matching layer, a piezoelectric layer, a dielectric layer and into a backing layer.
Figure 7:
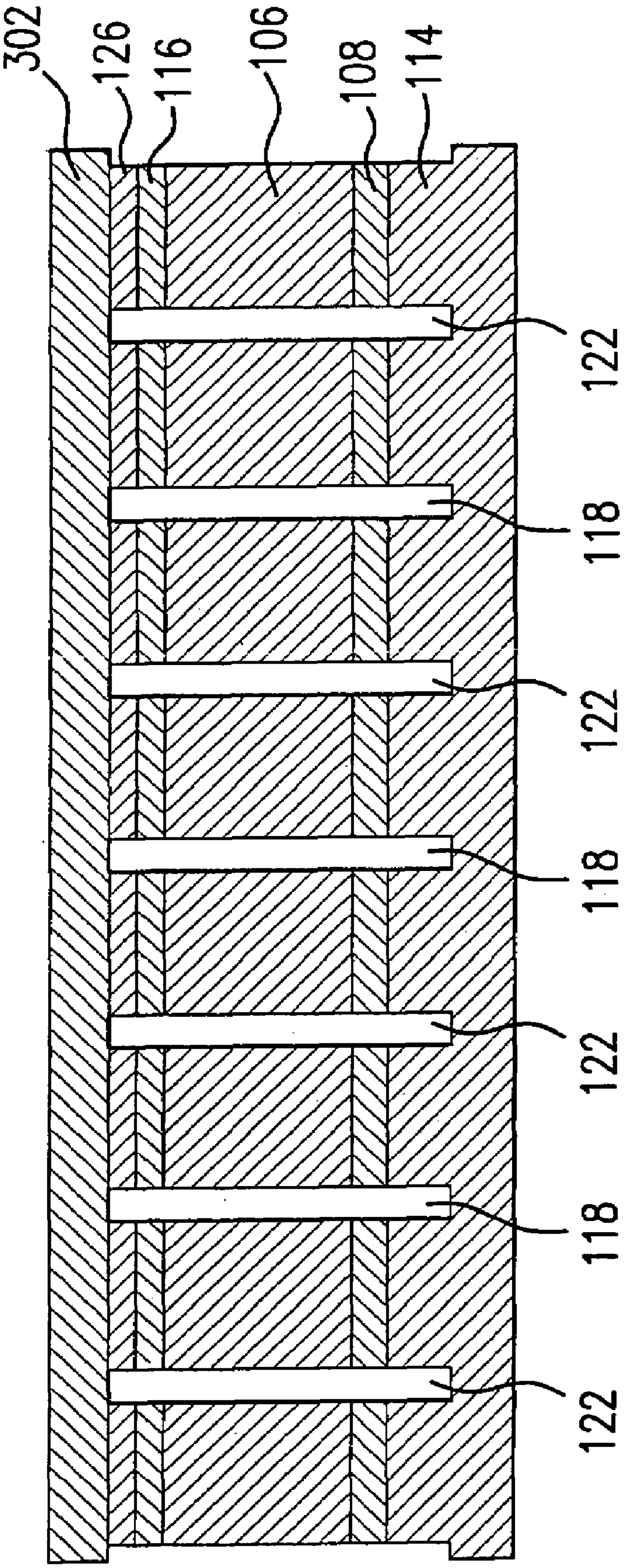
FIG. 7 is an exemplary partial cross-sectional view of the arrayed ultrasonic transducer of FIG. 1 taken transverse to the longitudinal axis Ls of the arrayed ultrasonic transducer, showing a plurality of first and second kerf slots extending through a first and second matching layer, a piezoelectric layer, a dielectric layer and into a backing layer.
Figure 8:
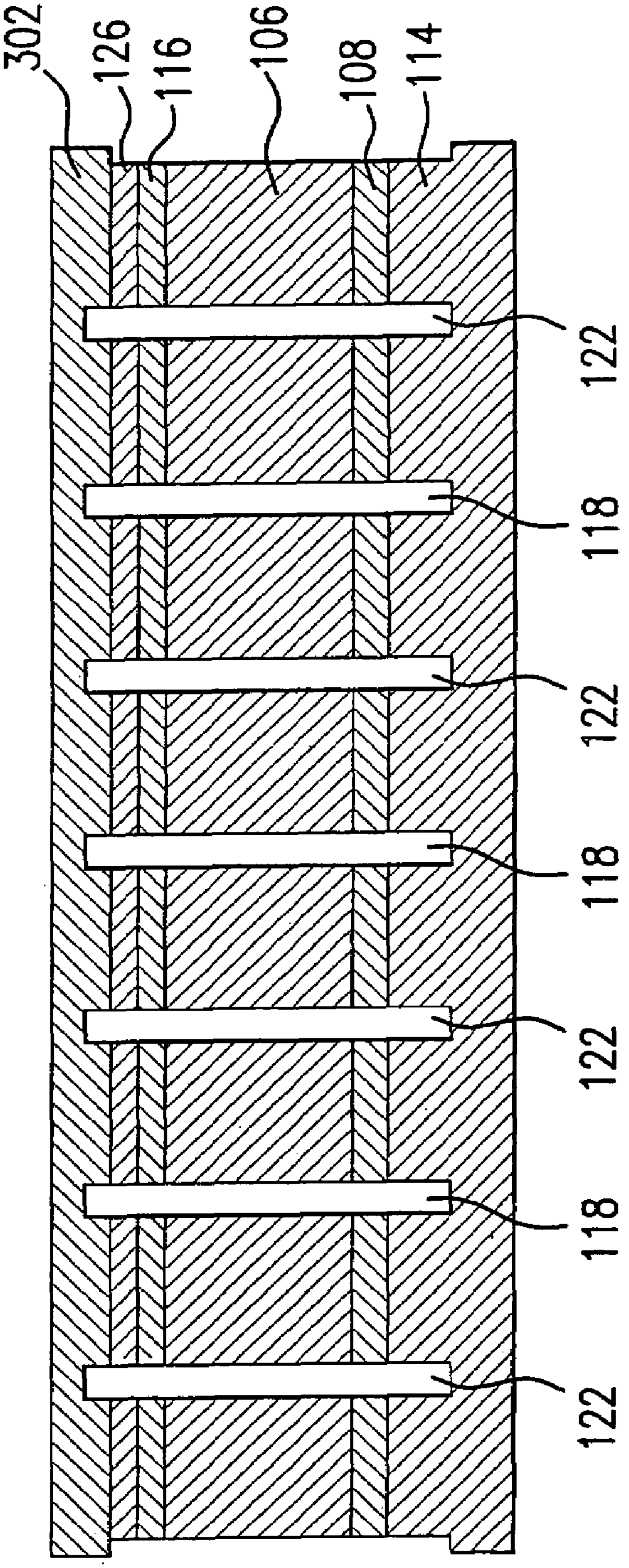
FIG. 8 is an exemplary partial cross-sectional view of the arrayed ultrasonic transducer of FIG. 1 taken transverse to the longitudinal axis Ls of the arrayed ultrasonic transducer, showing a plurality of first and second kerf slots extending through a first and second matching layer, a piezoelectric layer, a dielectric layer, and into a lens and a backing layer.
Figure 9:
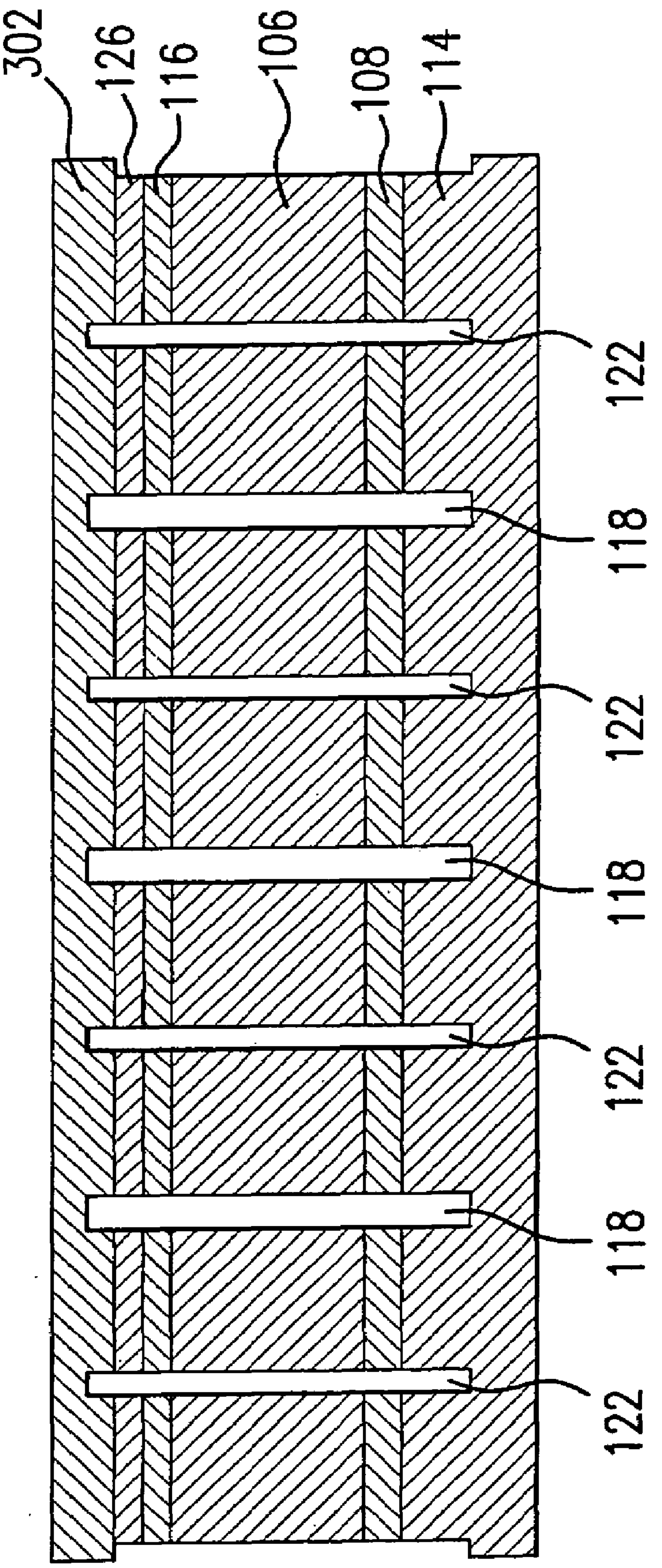
FIG. 9 is an exemplary partial cross-sectional view of the arrayed ultrasonic transducer of FIG. 1 taken transverse to the longitudinal axis Ls of the arrayed ultrasonic transducer, showing a plurality of first and second kerf slots extending through a first and second matching layer, a piezoelectric layer, a dielectric layer and into a lens, and a backing layer, wherein, in this example, the plurality of second kerf slots are narrower than the plurality of first kerf slots.
Figure 10:
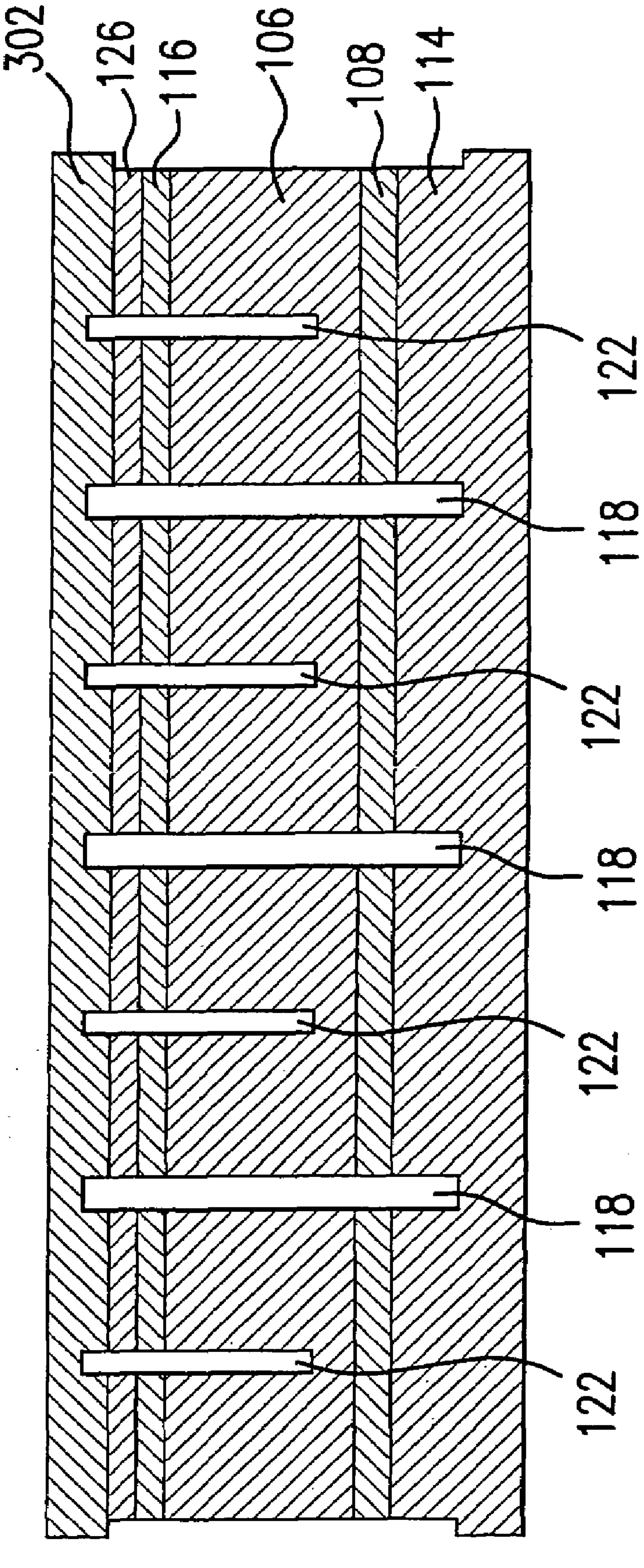
FIG. 10 is an exemplary partial cross-sectional view of the arrayed ultrasonic transducer of FIG. 1 taken transverse to the longitudinal axis Ls of the arrayed ultrasonic transducer, showing a plurality of first kerf slots extending through a first and second matching layer, a piezoelectric layer, a dielectric layer, and into a lens and a backing layer, and further showing a plurality of second kerf slots extending through a first and second matching layer, and into a lens, and a piezoelectric layer.
Figure 11:
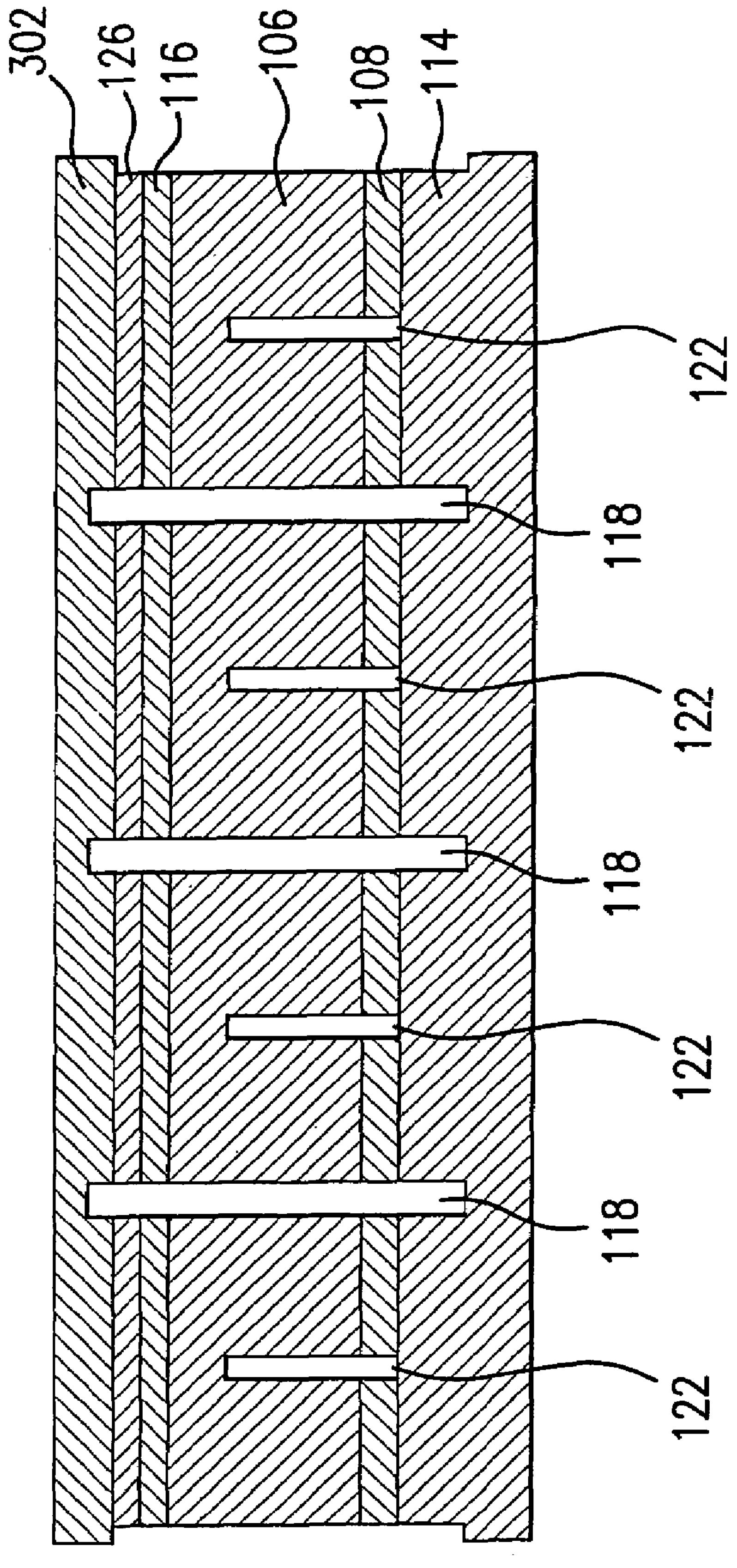
FIG. 11 is an exemplary partial cross-sectional view of the arrayed ultrasonic transducer of FIG. 1 taken transverse to the longitudinal axis Ls of the arrayed ultrasonic transducer, showing a plurality of first kerf slots extending through a first and second matching layer, a piezoelectric layer, a dielectric layer and into a lens and a backing layer, and further showing a plurality of second kerf slots extending through a dielectric layer and into a piezoelectric layer.
Figure 12A:
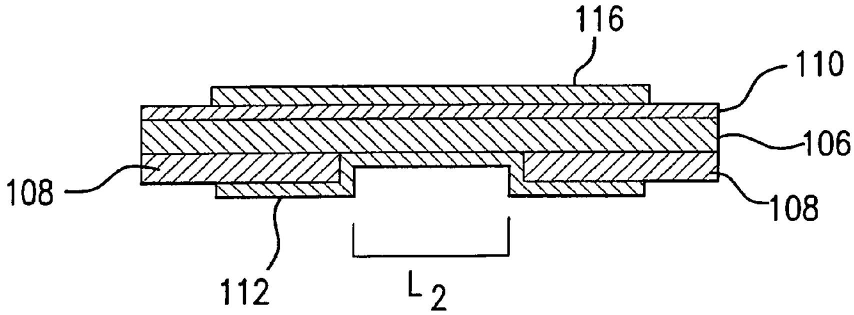
FIGS. 12A-G show an exemplary method for making an embodiment of an arrayed ultrasonic transducer of the present invention.
Figure 12B:
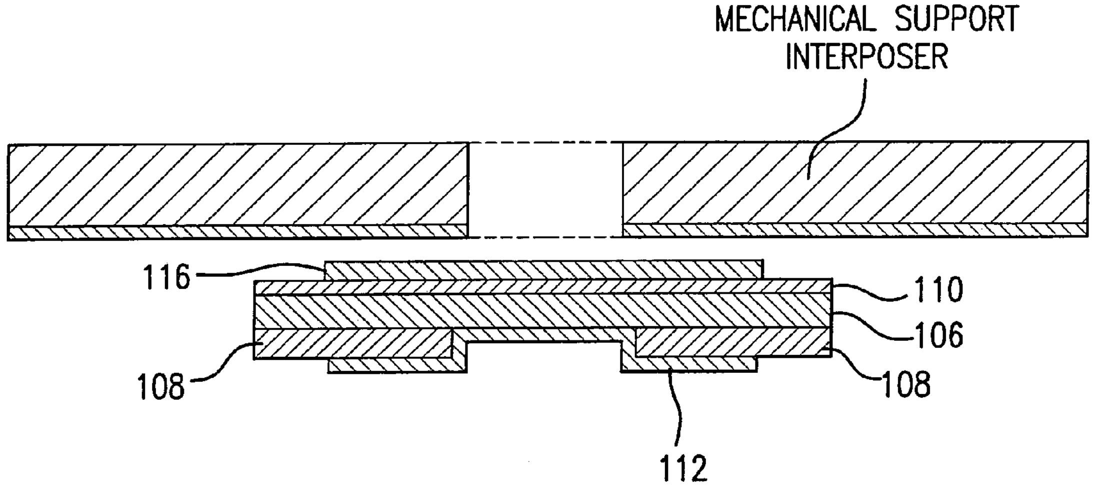
Figure 12C:
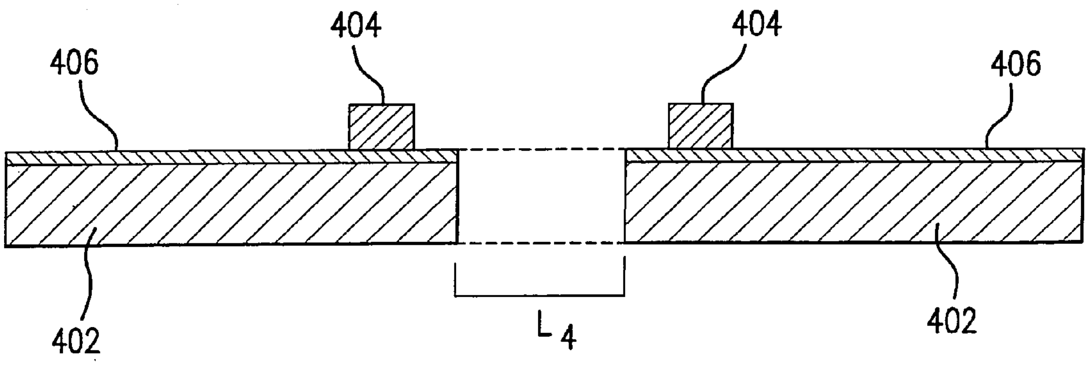
Figure 12D:
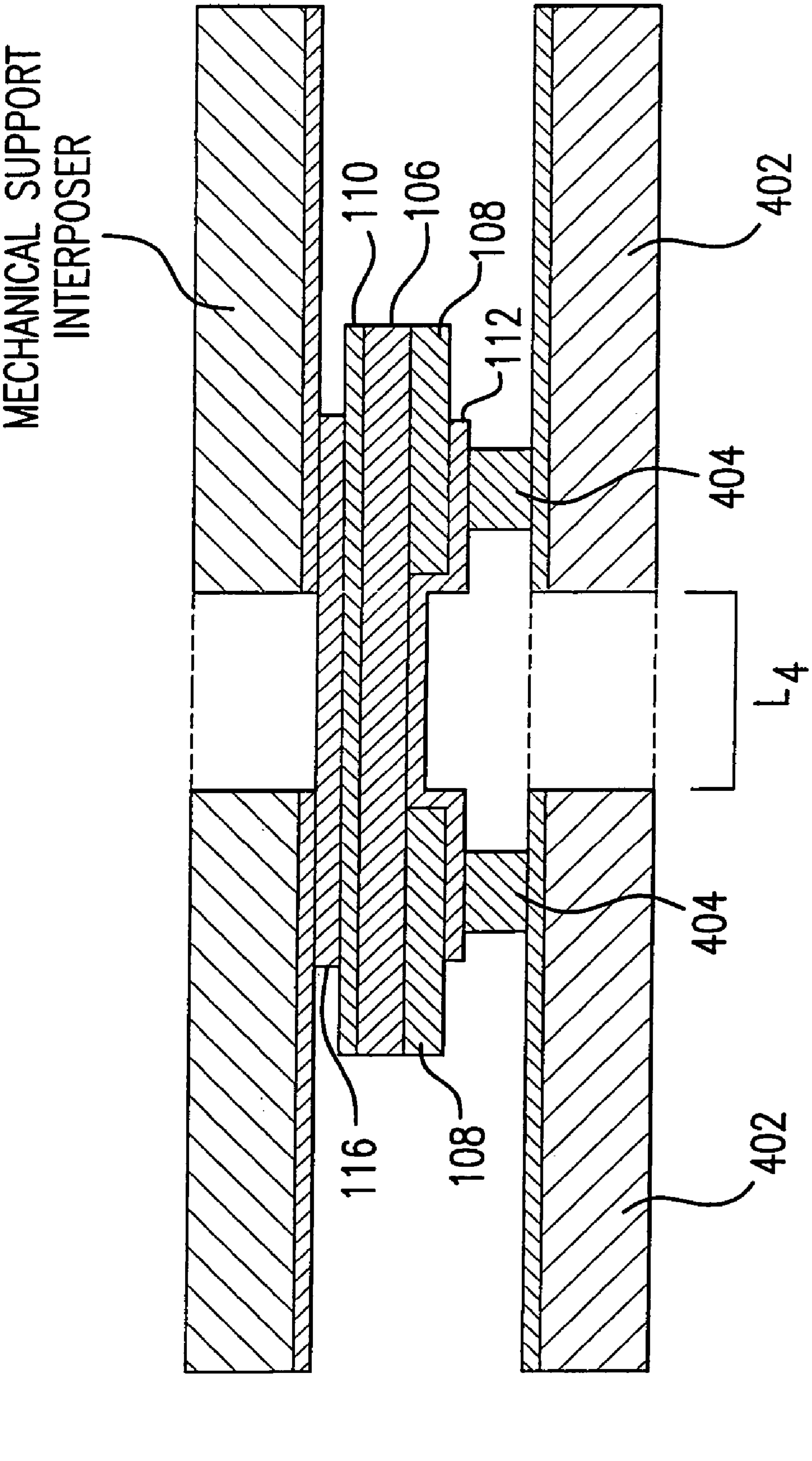
Figure 12E:
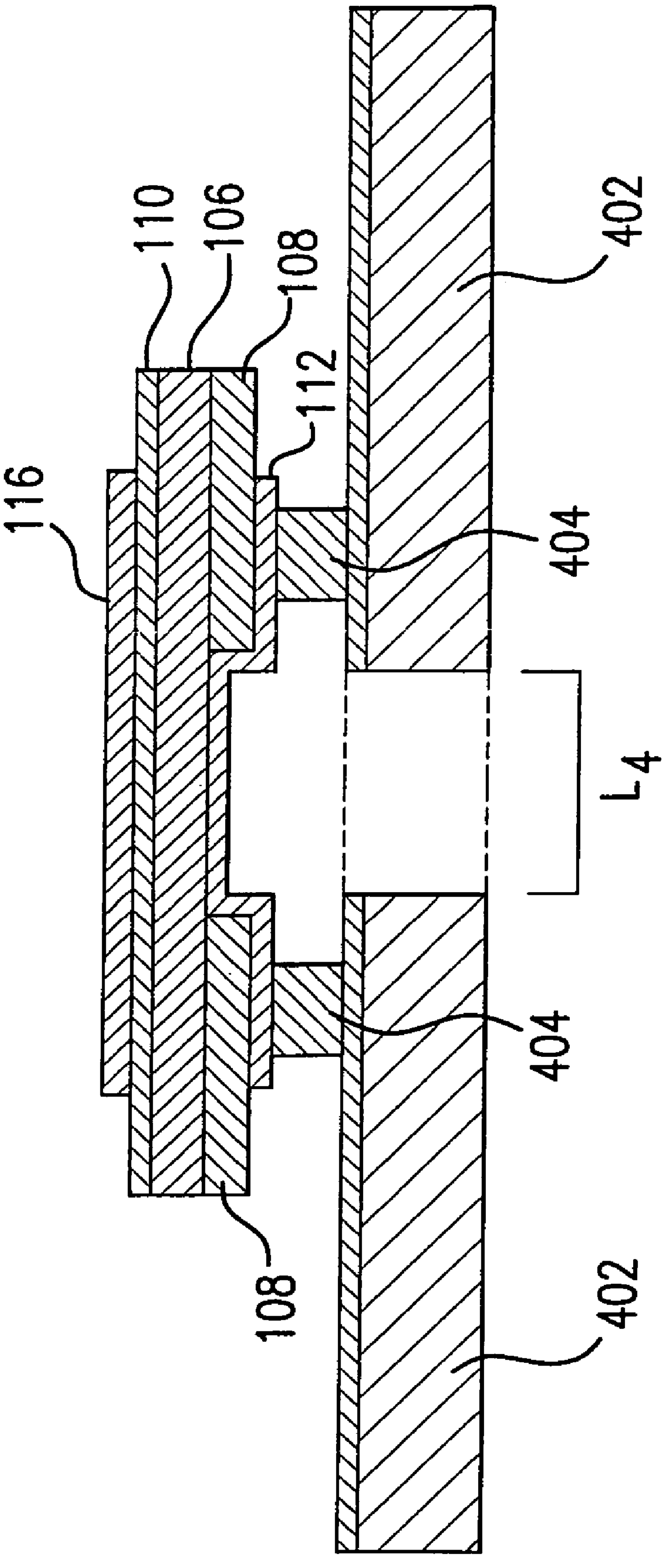
Figure 12F:
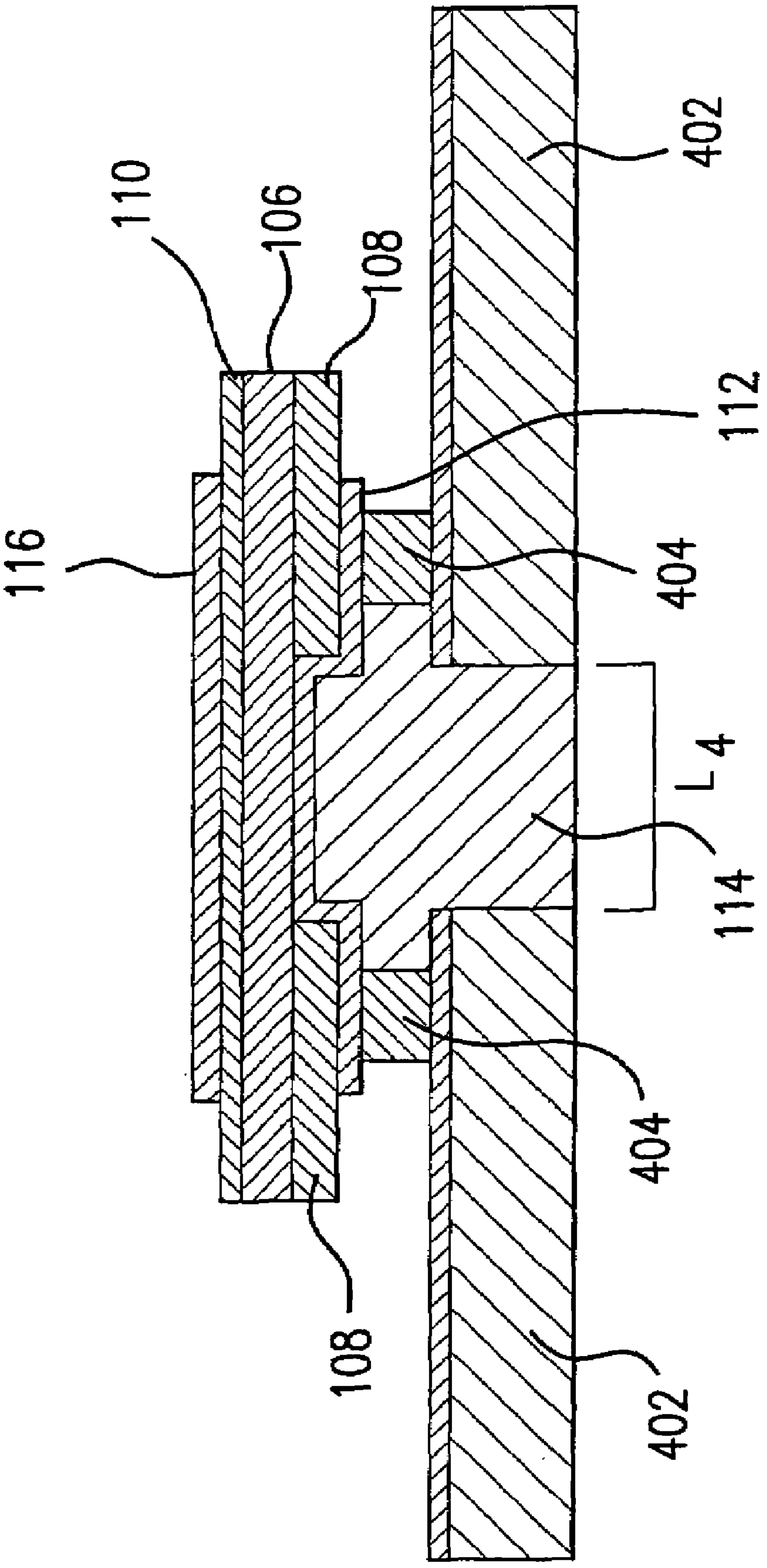
Figure 12G:
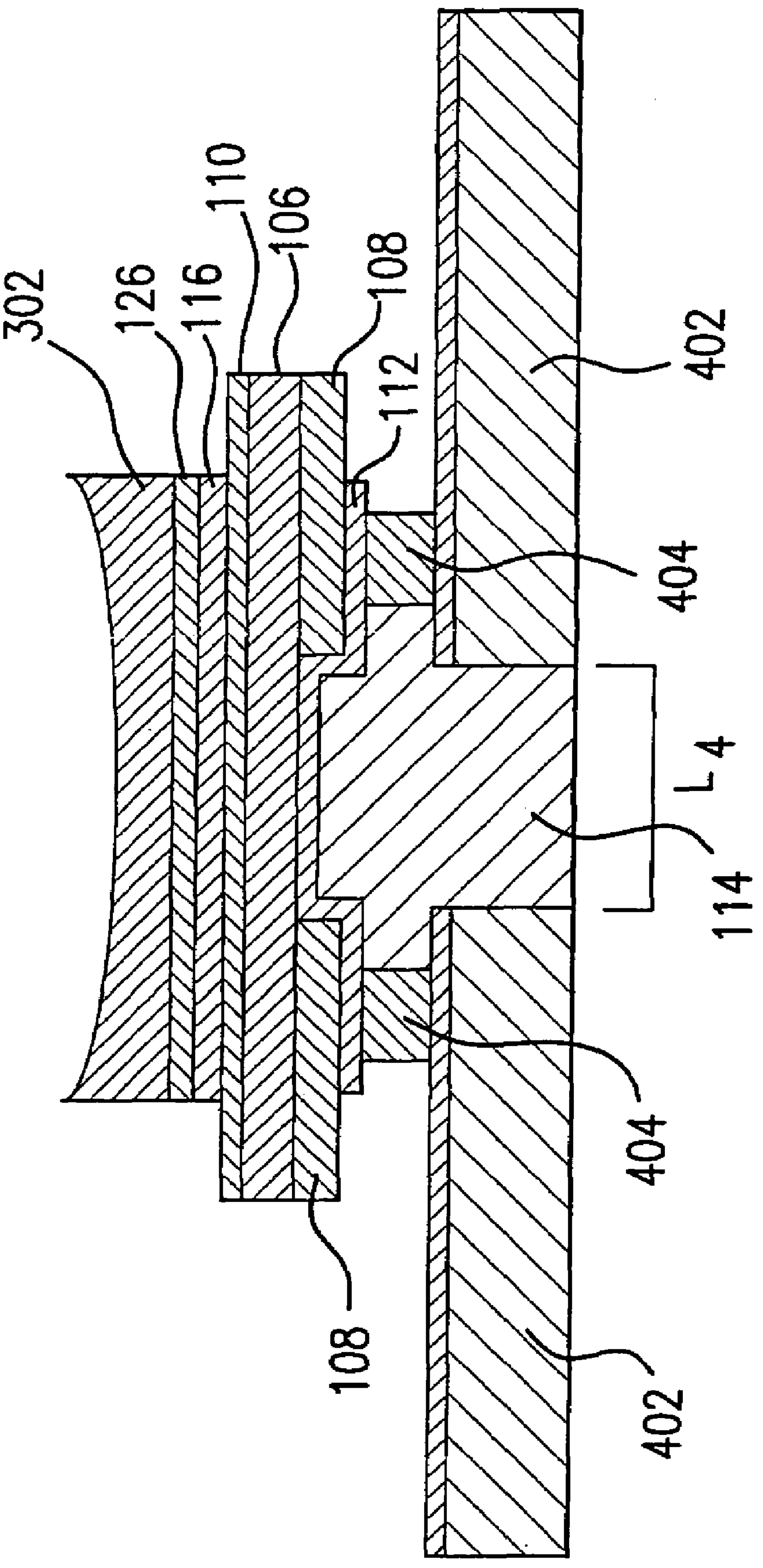

As used throughout, ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "30" is disclosed, then "about 30" is also disclosed. It is also understood that when a value is disclosed that "less than or equal to" the value, "greater than or equal to the value" and possible ranges between values are also disclosed, as appropriately understood by the skilled artisan. For example, if the value "30" is disclosed the "less than or equal to 30" as well as "greater than or equal to 30" is also disclosed.

It is also understood that throughout the application, data is provided in a number of different formats, and that this data, represents endpoints and starting points, and ranges for any combination of the data points. For example, if a particular data point "30" and a particular data point "100" are disclosed, it is understood that greater than, greater than or equal to, less than, less than or equal to, and equal to "30" and "100" are considered disclosed as well as between "30" and "100."

"Optional" or "optionally" means that the subsequently described event or circumstance can or cannot occur, and that the description includes instances where the event or circumstance occurs and instances where it does not.

The present invention is more particularly described in the following exemplary embodiments that are intended as illustrative only since numerous modifications and variations therein will be apparent to those skilled in the art. As used herein, "a," "an," or "the" can mean one or more, depending upon the context in which it is used.

Referring to FIGS. 1-11, in one aspect of the present invention, an ultrasonic transducer comprises a stack 100 having a first face 102, an opposed second face 104, and a longitudinal axis Ls extending therebetween. The stack comprises a plurality of layers, each layer having a top surface 128 and an opposed bottom surface 130. In one aspect, the plurality of layers of the stack comprises a piezoelectric layer 106 and a dielectric layer 108. In one aspect, the dielectric layer is connected to and underlies the piezoelectric layer.

The plurality of layers of the stack can further comprise a ground electrode layer 110, a signal electrode layer 112, a backing layer 114, and at least one matching layer. Additional layers cut can include, but are not limited to, temporary protective layers (not shown), an acoustic lens 302, photoresist layers (not shown), conductive epoxies (not shown), adhesive layers (not shown), polymer layers (not shown), metal layers (not shown), and the like.

The piezoelectric layer 106 can be made of a variety of materials. For example and not meant to be limiting, materials that form the piezoelectric layer can be selected from a group comprising ceramic, single crystal, polymer and copolymer materials, ceramic-polymer and ceramic-ceramic composites with 0-3, 2-2 and/or 3-1 connectivity, and the like. In one example, the piezoelectric layer comprises lead zirconate titanate (PZT) ceramic.

The dielectric layer 108 can define the active area of the piezoelectric layer. At least a portion of the dielectric layer can be deposited directly onto at least a portion of the piezoelectric layer by conventional thin film techniques, including but not limited to spin coating or dip coating. Alternatively, the dielectric layer can be patterned by means of photolithography to expose an area of the piezoelectric layer.

As exemplarily shown, the dielectric layer can be applied to the bottom surface of the piezoelectric layer. In one aspect, the dielectric layer does not cover the entire bottom surface of the piezoelectric layer. In one aspect, the dielectric layer defines an opening or gap that extends a second predetermined length L2 in a direction substantially parallel to the longitudinal axis of the stack. The opening in the dielectric layer is preferably aligned with a central region of the bottom surface of the piezoelectric layer. The opening defines the elevation dimension of the array. In one aspect, each element 120 of the array has the same elevation dimension and the width of the opening is constant within the area of the piezoelectric layer reserved for the active area of the device that has formed kerf slots. In one aspect, the length of the opening in the dielectric layer can vary in a predetermined manner in an axis substantially perpendicular to the longitudinal axis of the stack resulting in a variation in the elevation dimension of the array elements.

The relative thickness of the dielectric layer and the piezoelectric layer and the relative dielectric constants of the dielectric layer and the piezoelectric layer define the extent to which the applied voltage is divided across the two layers. In one example, the voltage can be split at 90% across the dielectric layer and 10% across the piezoelectric layer. It is contemplated that the ratio of the voltage divider across the dielectric layer and the piezoelectric layer can be varied. In the portion of the piezoelectric layer where there is no underlying dielectric layer, then the full magnitude of the applied voltage appears across the piezoelectric layer. This portion defines the active area of the array.

In this aspect, the dielectric layer allows for the use of a piezoelectric layer that is wider than the active area and allows for kerf slots (described below) to be made in the active area and extend beyond this area in such a way that array elements (described below) and array sub-elements (described below) are defined in the active area, but a common ground is maintained on the top surface.

A plurality of first kerf slots 118 are defined therein the stack. Each first kerf slot extends a predetermined depth therein the stack and a first predetermined length L1 in a direction substantially parallel to the longitudinal axis of the stack. One will appreciate that the "predetermined depth" of the first kerf slot can comprise a predetermined depth profile that is a function of position along the respective length of the first kerf slot. The first predetermined length of each first kerf slot is at least as long as the second predetermined length of the opening defined by the dielectric layer and is shorter than the longitudinal distance between the first face and the opposed second face of the stack in a lengthwise direction substantially parallel to the longitudinal axis of the stack. In one aspect, the plurality of first kerf slots define a plurality of ultrasonic array elements 120.

The ultrasonic transducer can also comprise a plurality of second kerf slots 122. In this aspect, each second kerf slot extends a predetermined depth therein the stack and a third predetermined length L3 in a direction substantially parallel to the longitudinal axis of the stack. As noted above, the "predetermined depth" of the second kerf slot can comprise a predetermined depth profile that is a function of position along the respective length of the second kerf slot. The length of each second kerf slot is at least as long as the second predetermined length of the opening defined by the dielectric layer and is shorter than the longitudinal distance between the first face and the opposed second face of the stack in a lengthwise direction substantially parallel to the longitudinal axis of the stack. In one aspect, each second kerf slot is positioned adjacent to at least one first kerf slot.

In one aspect, the plurality of first kerf slots define a plurality of ultrasonic array elements and the plurality of second kerf slots define a plurality of ultrasonic array sub-elements 124. For example, an array of the present invention without any second kerf slots has one array sub-element per array element and an array of the present invention with one second kerf slot between two respective first kerf slots has two array sub-elements per array element.

One skilled in the art will appreciate that because neither the first or second kerf slots extend to either of the respective first and second faces of the stack, i.e., the kerf slots have an intermediate length, the formed array elements are supported by the contiguous portion of the stack near the respective first and second faces of the stack.

The piezoelectric layer of the stack of the present invention can resonate at frequencies that are considered high relative to current clinical imaging frequency standards. In one aspect, the piezoelectric layer resonates at a center frequency of about 30 MHz. In other aspects, the piezoelectric layer resonates at a center frequency of about and between 10-200 MHz, preferably about and between, 20-150 MHz, and more preferably about and between 25-100 MHz.

In one aspect, each of the plurality of ultrasonic array sub-elements has an aspect ratio of width to height of about and between 0.2-1.0, preferably about and between 0.3-0.8, and more preferably about and between 0.4-0.7. In one aspect, an aspect ratio of width to height of less than about 0.6 for the cross-section of the piezoelectric elements is used. This aspect ratio, and the geometry resulting therefrom, separates lateral resonance modes of an array element from the thickness resonant mode used to create the acoustic energy. Similar cross-sectional designs can be considered for arrays of other types as understood by one skilled in the art.

As described above, a plurality of first kerf slots are made to define a plurality of array elements, which are schematically illustrated in FIG. 1 as array elements 1, 2, 3, 4, . . . to N array elements. In one non-limiting example for a 64-element array with two sub-diced elements per array element, 129 second kerf slots are made to produce 128 piezo electric sub-elements that make up the 64 elements of the array. It is contemplated that this number can be increased for a larger array. For an array without sub-dicing, 65 and 257 first kerf slots can be used for array structures with 64 and 256 array elements respectively. In one aspect, the first and/or second kerf slots can be filled with air. In an alternative aspect, the first and/or second kerf slots can also be filled with a liquid or a solid, such as, for example, a polymer.

The formation of sub-elements by "sub-dicing," using a plurality of first and second kerf slots is a technique in which two adjacent sub-elements are electrically shorted together, such that the pair of shorted sub-elements act as one element of the array. For a given element pitch, which is the center to center spacing of the array elements resulting from the first kerf slots, sub-dicing allows for an improved element width to height aspect ratio such that unwanted lateral resonances within the element are shifted to frequencies outside of the desired bandwidth of the operation of the device.

At low frequencies, fine dicing blades can be used to sub-dice array elements. At high frequencies, sub-dicing becomes more difficult due to the reduced dimension of the array element. For high frequency array design at greater than about 20 MHz, the idea of sub-dicing can, at the expense of a larger element pitch, lower the electrical impedance of a typical array element, and increase the signal strength and sensitivity of an array element. The pitch of an array can be described with respect to the wavelength of sound in water at the center frequency of the device. For example, a wavelength of 50 microns is a useful wavelength to use when referring to a transducer with a center frequency of 30 MHz. With this in mind, a linear array with an element pitch of about and between 0.5λ-2.0λ is acceptable for most applications.

In one aspect, the piezoelectric layer of the stack of the present invention has a pitch of about and between 7.5-300 microns, preferably about and between 10-150 microns, and more preferably about and between 15-100 microns. In one example and not meant to be limiting, for a 30 MHz array design, the resulting pitch for a 1.5λ is about 74 microns.

In another aspect, and not meant to be limiting, for a stack with a piezoelectric layer of about 60 microns thick having a first kerf slot about 8 microns wide and spaced 74 microns apart and with a second kerf slot positioned adjacent to at least one first kerf slot that also has a kerf width of about 8 microns, results in array sub-elements with a desirable width to height aspect ratio and a 64 element array with a pitch of about 1.5λ. If sub-dicing is not used and all of the respective kerf slots are first kerf slots, then the array structure can be constructed and arranged to form a 128 element 0.75λ pitch array.

At high frequencies, when the width of the array elements and of the kerf slots scale down to the order of 1-10's of microns, it is desirable in array fabrication to make narrow kerf slots. One skilled in the art will appreciate that narrowing the kerf slots can minimize the pitch of the array such that the effects of grating lobes of energy can be minimized during normal operation of the array device. Further, by narrowing the kerf slots, the element strength and sensitivity are maximized for a given array pitch by removing as little of the piezoelectric layer as possible. Using laser machining, the piezoelectric layer may be patterned with a fine pitch and maintain mechanical integrity.

Laser micromachining can be used to extend the plurality of first and/or second kerf slots to their predetermined depth into the stack. Laser micromachining offers a non-contact method to extend or "dice" the kerf slots. Lasers that can be used to "dice" the kerf slots include, for example, visible and ultraviolet wavelength lasers and lasers with pulse lengths from 100 ns-1 fs, and the like. In one aspect of the disclosed invention, the heat affected zone (HAZ) is minimized by using shorter wavelength lasers in the UV range and/or picosecond-femtosecond pulse length lasers.

Laser micromachining can direct a large amount of energy in as small a volume as possible in as short a time as possible to locally ablate the surface of a material. If the absorption of incident photons occurs over a short enough time period, then thermal conduction does not have time to take place. A clean ablated slot is created with little residual energy, which avoids localized melting and minimizes thermal damage. It is desirable to choose laser conditions that maximize the consumed energy within the vaporized region while minimizing damage to the surrounding piezoelectric layer.

To minimize the HAZ, the energy density of the absorbed laser pulse can be maximized and the energy can be prevented from dissipating within the material via thermal conduction mechanisms. Two exemplified types of lasers that can be used are ultraviolet (UV) lasers and femtosecond (fs) lasers. UV lasers have a very shallow absorption depth in ceramic and therefore the energy is contained in a shallow volume. Fs lasers, which have a very short time pulse (about 10-15 s) and therefore the absorption of energy takes place on this time scale. In one example, any need to repole the piezoelectric layer after laser cutting is not required.

UV excimer lasers are adapted for the manufacturing of complex micro-structures for the production of micro-optical-electro-mechanical-systems (MOEMS) units such as nozzles, optical devices, sensors and the like. Excimer lasers provide material processing with low thermal damage and with high resolution due to high peak power output in short pulses at several ultraviolet wavelengths.

In general, and as one skilled in the art will appreciate, the ablated depth for a given laser micromachining system is strongly dependent on the energy per pulse and on the number of pulses. The ablation rate can be almost constant and fairly independent for a given laser fluence up to a depth beyond which the rate decreases rapidly and saturates to zero. By controlling the number of pulses per position incident on the piezoelectric stack, a predetermined kerf depth as a function of position can be achieved up to the saturation depth for a given laser fluence. The saturation depth can be attributed to the absorption of the laser energy by the plasma plume (created during the ablation process) and by the walls of the laser trench. The plasma in the plume can be denser and more absorbing when it is confined within the walls of a deeper trench; in addition, it may take longer for the plume to expand. The time between the beginning of the laser pulse and the start of the plume attenuation is generally a few nanoseconds at a high fluence. For lasers with pulse lengths of 10's of ns, this means that the later portion of the laser beam will interact with the plume. The use of picosecond—femtosecond lasers can avoid the interaction of the laser beam with the plume.

In one aspect, the laser used to extend the first or second kerf slots into or through the piezoelectric layer is a short wavelength laser such as, for example, a KrF Excimer laser system (having, for example, about a 248 nm wavelength). Another example of a short wavelength laser that may be used is an argon fluoride laser (having, for example, about a 193 nm wavelength). In another aspect, the laser used to cut the piezoelectric layer is a short pulse length laser. For example, lasers modified to emit a short pulse length on the order of ps to fs can be used.

A KrF excimer laser system (UV light with a wavelength of about 248 nm) with a fluence range of about and between 0-20 J/cm2 (preferably about and between 0.5-10.0 J/cm2 for PZT ceramic) can be used to laser cut kerf slots about and between 1-30 μm wide (more preferably between 5-10 μm wide) through the piezoelectric layer about and between 1-200 μm thick (preferably between 10-150 μm thick). The actual thickness of the piezoelectric layer is most commonly based on a thickness that ranges from ¼λ to ½ λ based on the speed of sound of the material and the intended center frequency of the array transducer. As would be clear to one skilled in the art, the choice of backing layer and matching layer(s) and their respective acoustic impedance values dictate the final thickness of the piezoelectric layer. The target thickness can be further fine-tuned based on the specific width to height aspect ratio of each sub-element of the array, which would also be clear to one skilled in the art. The wider the kerf width and the higher the laser fluence, the deeper the excimer laser can cut. The number of laser pulses per unit area can also allow for a well-defined depth control. In another aspect, a lower fluence laser pulse, i.e., less than about 1 J/cm2-10 J/cm2 can be used to laser ablate through polymer based material and through thin metal layers.

As noted above, the plurality of layers can further include a signal electrode layer 112 and a ground electrode layer 110. The electrodes can be defined by the application of a metallization layer (not shown) that covers the dielectric layer and the exposed area of the piezoelectric layer. The electrode layers can comprise any metalized surface as would be understood by one skilled in the art. A non-limiting example of electrode material that can be used is Nickel (Ni). A metalized layer of lower resistance (at 1-100 MHz) that does not oxidize can be deposited by thin film deposition techniques such as sputtering (evaporation, electroplating, etc.). A Cr/Au combination (300/3000 Angstroms respectively) is an example of such a lower resistance metalized layer, although thinner and thicker layers can also be used. The Cr is used as an interfacial adhesion layer for the Au. As would be clear to one skilled in the art, it is contemplated that other conventional interfacial adhesion layers well known in the semiconductor and microfabrication fields can be used.

At least a portion of the top surface of the signal electrode layer is connected to at least a portion of the bottom surface of the piezoelectric layer and at least a portion of the top surface of the signal electrode layer is connected to at least a portion of the bottom surface of the dielectric layer. In one aspect, the signal electrode is wider than the opening defined by the dielectric layer and covers the edge of the dielectric layer in the areas that are above the conductive material 404 used to surface mount the stack to the interposer, as described herein.

In one aspect, the signal electrode pattern deposited is one that covers the entire surface of the bottom surface of the piezoelectric layer or is a predetermined pattern of suitable area that extends across the opening defined by the dielectric layer. The original length of the signal electrode may be longer than the final length of the signal electrode. The signal electrode may be trimmed (or etched) into a more intricate pattern that results in a shorter length.

A laser (or other material removal techniques such as reactive ion etching (RIE) etc.) can be used to remove some of the deposited electrode to create the final intricate signal electrode pattern. In one aspect, a signal electrode of simple rectangular shape, that is longer than the dielectric gap, is deposited by sputtering (300/3000 Cr/Au respectively—although thicker and thinner layers are contemplated). The signal electrode is then patterned by means of a laser.

A shadow mask and standard 'wet bench' photolithographic processes can also be used to directly create the same, or similar, signal electrode pattern, which is of more intricate detail.

In another aspect, at least a portion of the bottom surface of the ground electrode layer is connected to at least a portion of the top surface of the piezoelectric layer. At least a portion of the top surface of the ground electrode layer is connected to at least a portion of the bottom surface of a first matching layer 116. In one aspect, the ground electrode layer is at least as long as the second predetermined length of the opening defined by the dielectric layer in a lengthwise direction substantially parallel to the longitudinal axis of the stack. In another aspect, the ground electrode layer is at least as long as the first predetermined length of each first kerf slot in a lengthwise direction substantially parallel to the longitudinal axis of the stack. In yet another aspect, the ground electrode layer connectively overlies substantially all of the top surface of the piezoelectric layer.

In one aspect, the ground electrode layer is at least as long as the first predetermined length of each first kerf slot (as described above) and the third predetermined length of each second kerf slot in a lengthwise direction substantially parallel to the longitudinal axis of the stack. In one aspect, part of the ground electrode typically remains exposed in order to allow for the signal ground to be connected from the ground electrode to the signal ground trace (or traces) on the interposer 402 (described below).

In one example, the electrodes, both signal and ground, can be applied by a physical deposition technique (evaporation or sputtering) although other processes such as, for example, electroplating, can also be used. In a preferred aspect, a conformal coating technique is used, such as sputtering, to achieve good step coverage in the areas in the vicinity to the edge of the dielectric layer.

As noted above, in the regions where there is no dielectric layer, the full potential of the electric signal applied to the signal electrode and the ground electrode exists across the piezoelectric layer. In the regions where there is a dielectric layer, the full potential of the electric signal is distributed across the thickness of the dielectric layer and the thickness of the piezoelectric layer. In one aspect, the ratio of electric potential across the dielectric layer to electric potential across the piezoelectric layer is proportional to the thickness of the dielectric layer to the thickness of the piezoelectric layer and is inversely proportional to the dielectric constant of the dielectric layer to the dielectric constant of the piezoelectric layer.

The plurality of layers of the stack can further comprise at least one matching layer having a top surface and an opposed bottom surface. In one aspect, the plurality of layers comprises two such matching layers. At least a portion of the bottom surface of the first matching layer 116 can be connected to at least a portion of the top surface of the piezoelectric layer. If a second matching layer 126 is used, at least a portion of the bottom surface of the second matching layer is connected to at least a portion of the top surface of the first matching layer. The matching layer(s) can be at least as long as the second predetermined length of the opening defined by the dielectric layer in a lengthwise direction substantially parallel to the longitudinal axis of the stack.

The matching layer(s) has a predetermined acoustic impedance and target thickness. For example, powder (vol %) mixed with epoxy can be used to create a predetermined acoustic impedance. The matching layer(s) can be applied to the top surface of the piezoelectric layer, allowed to cure and then lapped to the correct target thickness. One skilled in the art will appreciate that the matching layer(s) can have a thickness that is usually equal to about or around equal to ¼ of a wavelength of sound, at the center frequency of the device, within the matching layer material itself. The specific thickness range of the matching layers depends on the actual choice of layers, their specific material properties, and the intended center frequency of the device. In one example and not meant to be limiting, for polymer based matching layer materials, and at 30 MHz, this results in a preferred thickness value of about 15-25 um.

In one aspect, the matching layer(s) can comprise PZT 30% by volume mixed with 301-2 Epotek epoxy having an acoustic impedance of about 8 Mrayl. In one aspect, the acoustic impedance can be between about 8-9 Mrayl, in another aspect, the impedance can be between about 3-10 Mrayl, and, in yet another aspect, the impedance can be between about 1-33 Mrayl. The preparation of the powder loaded epoxy and the subsequent curing of the material onto the top face of the piezoelectric layer such that there are substantially no air pockets within the layer is known to one skilled in the art. The epoxy can be initially degassed, the powder mixed in and then the mixture degassed a second time. The mixture can be applied to the surface of the piezoelectric layer at a setpoint temperature that is elevated from room temperature (20-200° C.) with 80° C. being used for 301-2 epoxy. The epoxy generally cures in 2 hours. In one aspect and not meant to be limiting, the thickness of the first matching layer is about ¼ wavelength and is about 20 μm thick for 30% by volume PZT in 301-2 epoxy.

The plurality of layers of the stack can further comprise a backing layer 114 having a top surface and an opposed bottom surface. In one aspect, the backing layer substantially fills the opening defined by the dielectric layer. In another aspect, at least a portion of the top surface of the backing layer is connected to at least a portion of the bottom surface of the dielectric layer. In a further aspect, substantially all of the bottom surface of the dielectric layer is connected to at least a portion of top surface of the backing layer. In yet another aspect, at least a portion of the top surface of the backing layer is connected to at least a portion of the bottom surface of the piezoelectric layer.

As one skilled in the art will appreciate, the matching and backing layers can be selected from materials with acoustic impedance between that of air and/or water and that of the piezoelectric layer. In addition, as one skilled in the art will appreciate, an epoxy or polymer can be mixed with metal and/or ceramic powder of various compositions and ratios to create a material of variable acoustic impedance and attenuation. Any such combinations of materials are contemplated in this disclosure. The choice of matching layer(s), ranging from 1-6 discrete layers to one gradually changing layer, and backing layer(s), ranging from 0-5 discrete layers to one gradually changing layer alters the thickness of the piezoelectric layer for a specific center frequency.

In one aspect, for a 30 MHz piezoelectric array transducer with two matching layers and one backing layer the thickness of the piezoelectric layer is between about 50 μm to about 60 μm. In other non-limiting examples, the thickness can range between about 40 μm to 75 μm. For transducers with center frequencies in the range of 25-50 MHz and for a different number of matching and backing layers, the thickness of the piezoelectric layer is scaled accordingly based on the knowledge of the materials being used and one skilled in the art of transducer design can determine the appropriate dimensions.

A laser can be used to modify one (or both) surface(s) of the piezoelectric layer. One such modification can be the creation of a curved ceramic surface prior to the application of the matching and backing layers. This is an extension of the variable depth control methodology of laser cutting applied in two dimensions. After curving the surface with the 2-dimentional removal of material, a metallization layer (not shown) can be deposited. A re-poling of the piezoelectric layer can also be used to realign the electric dipoles of the piezoelectric layer material.

In one aspect, a lens 302 can be positioned in substantial overlying registration with the top surface of the layer that is the uppermost layer of the stack. The lens can be used for focusing the acoustic energy. The lens can be made of a polymeric material as would be known to one skilled in the art. For example, a preformed or prefabricated piece of Rexolite which has three flat sides and one curved face can be used as a lens. The radius of curvature (R) is determined by the intended focal length of the acoustic lens. For example not meant to be limiting, the lens can be conventionally shaped using computerized numerical control equipment, laser machining, molding, and the like. In one aspect, the radius of curvature is large enough such that the width of the curvature (WC) is at least as wide as the opening defined by the dielectric layer.

In one preferred aspect, the minimum thickness of the lens substantially overlies the center of the opening or gap defined by the dielectric layer. Further, the width of the curvature is greater than the opening or gap defined by the dielectric layer. In one aspect, the length of the lens can be wider than the length of a kerf slot allowing for all of the kerf slots to be protected and sealed once the lens is mounted on the top of the transducer device.

In one aspect, the flat face of the lens can be coated with an adhesive layer to provide for bonding the lens to the stack. In one example, the adhesive layer can be a SU-8 photoresist layer that serves to bond the lens to the stack. One will appreciate that the applied adhesive layer can also act as a second matching layer 126 provided that the thickness of the adhesive layer applied to the bottom face of the lens is of an appropriate wavelength in thickness (such as, for example ¼ wavelength in thickness). The thickness of the exemplified SU-8 layer can be controlled by normal thin film deposition techniques (such as, for example, spin coating).

A film of SU-8 becomes sticky (tacky) when the temperature of the coating is raised to about 60-85° C. At temperatures higher than 85° C., the surface topology of the SU-8 layer may start to change. Therefore in a preferred aspect this process is performed at a set point temperature of 80° C. Since the SU-8 layer is already in solid form, and the elevated temperature only causes the layer to become tacky, then once the layer is attached to the stack, the applied SU-8 does not flow down the kerfs of the array. This maintains the physical gap and mechanical isolation between the formed array elements.

To avoid trapping air in between the SU-8 layer and the first matching layer, it is preferred that this bonding process take place in a partial vacuum. After the bonding has taken place, and the sample cooled to room temperature, a UV exposure of the SU-8 layer (through the Rexolite layer) can be used to cross link the SU-8, to make the layer more rigid, and to improve adhesion.

Prior to mounting the lens onto the stack, the SU-8 layer and the lens can be laser cut, which effectively extends the array kerfs (first and/or second array kerf slots), and in one aspect, the sub-diced or second kerfs, through both matching layers (or if two matching layers are used) and into the lens. If the SU-8 and lens are laser cut, a pick and place machine (or an alignment jig that is sized and shaped to the particular size and shape of the actual components being bonded together) can be used to align the lens in both X and Y on the uppermost surface of the top layer of the stack. To laser cut the SU-8 and lens the laser fluence of approximately 1-5 J/cm2 can be used.

At least one first kerf slot can extend through or into at least one layer to reach its predetermined depth/depth profile in the stack. Some or all of the layers of the stack can be cut through or into substantially simultaneously. Thus, a plurality of the layers can be selectively cut through substantially at the same time. Moreover, several layers can be selectively cut through at one time, and other layers can be selectively cut through at subsequent times, as would be clear to one skilled in the art. In one aspect, at least a portion of at least one first and/or second kerf slot extends to a predetermined depth that is at least 60% of the distance from the top surface of the piezoelectric layer to the bottom surface of the piezoelectric layer and at least a portion of at least one first and/or second kerf slot can extend to a predetermined depth that is 100% of the distance from the top surface of the piezoelectric layer to the bottom surface of the piezoelectric layer.

At least a portion of at least one first kerf slot can extend to a predetermined depth into the dielectric layer and at least a portion of one first kerf slot can also extend to a predetermined depth into the backing layer. As would be clear to one skilled in the art, the predetermined depth into the backing layer can vary from 0 microns to a depth that is equal to or greater than the thickness of the piezoelectric layer itself. Laser micromachining through the backing layer can provide a significant improvement in isolation between adjacent elements. In one aspect, at least a portion of one first kerf slot extends through at least one layer and extends to a predetermined depth into the backing layer. As described herein, the predetermined depth into the backing layer may vary. The predetermined depth of at least a portion of at least one first kerf slot can vary in comparison to the predetermined depth of another portion of that same respective kerf slot or to a predetermined depth of at least a portion of another kerf slot in a lengthwise direction substantially parallel to the longitudinal axis of the stack. In another aspect, the predetermined depth of at least one first kerf slot can be deeper than the predetermined depth of at least one other kerf slot.

As described above, at least one second kerf slot can extend through at least one layer to reach its predetermined depth in the stack as described above for the first kerf slots. The second kerf slots can extend into or through at least one layer of the stack as described above for the first kerf slots. If layers of the stack are cut independently, each kerf slot in a given layer of the stack, whether a first or second kerf slot can be in substantial overlying registration with its corresponding slot in an adjacent layer.

In a preferred methodology, the kerf slots are laser cut into the piezoelectric layer after the stack has been mounted onto the interposer and a backing layer has been applied.

The ultrasonic transducer can further comprise an interposer 402 having a top surface and an opposed bottom surface. In one aspect, the interposer defines a second opening extending a fourth predetermined length L4 in a direction substantially parallel to the longitudinal axis Ls of the stack. The second opening allows for easy application of the backing layer to the bottom surface of the piezoelectric stack.

A plurality of electrical traces 406 can be positioned on the top surface of the interposer in a predetermined pattern and the signal electrode layer 112 can also define an electrode pattern. The stack, including the signal electrode 112 with a defined electrode pattern, can be mounted in substantial overlying registration with the interposer 402 such that the electrode pattern defined by the signal electrode layer is electrically coupled with the predetermined pattern of electrical traces positioned on the top surface of the interposer. The interposer can also act as a redistribution layer for electrical leads to the individual elements of the array. The ground electrode 110 of the array can be connected to the traces on the interposer reserved for ground connections. These connections can be made in advance of attaching the lens, if a lens is used. If the area of the lens material is small enough such that a part of the ground electrode is still exposed, however, the connections can be made after the lens is attached. There are many conducting epoxies and paints that can be used to make these connections that are well known by someone skilled in the art. Wirebonding can also be used to make these connections as would be clear to one skilled in the art. For example, wirebonding can be used to make connections from the interposer to a flex circuit and to make connections from the stack to the interposer. Thus, it is contemplated that surface mounting can be performed using methods known in the art, for example, and not meant to be limiting, by using an electrically conducting surface mount material, including but not limited to solder, or by using wirebonding.

The backing material 114 can be made as described herein. In one non-limiting example, the backing material can be made from powder (vol %) mixed with epoxy which can be used to create a predetermined acoustic impedance. PZT 30% mixed with 301-2 Epotek epoxy has acoustic impedance of 8 Mrayl, and is non-conducting. When using an epoxy based backing, where some curing in-situ within the second opening defined by the interposer takes place, the use of a rigid plate bonded to the top surface of the stack can be used to help minimize warping of the stack. The epoxy-based backing layer can be composed of other powders such as, for example, tungsten, alumina, and the like. It will be appreciated that other conventional backing materials are contemplated such as, for example, a conductive silver epoxy.

To reduce the amount of material that needs to be cured in-situ a backing layer can be prefabricated and cut to an appropriate size after it has cured such that it fits through the opening defined by the interposer. The top surface of the prefabricated backing can be coated with a fresh layer of backing material (or other adhesive) and be located in the second opening defined by the interposer. By reducing the amount of material curing in-situ, the amount of residual stress induced within the stack can be reduced and the surface of the piezoelectric can remain substantially flat or planar. The rigid plate can be removed after the bonding of the backing is complete.

The array of the present invention can be of any shape as would be clear to one of skill in the art and includes linear arrays, sparse linear arrays, 1.5 Dimensional arrays, and the like.

Exemplified Methodology for Fabricating an Ultrasonic Array

Provided herein is a method of fabricating an ultrasonic array, comprising cutting a piezoelectric layer 106 with a laser, wherein said piezoelectric layer resonates at a high ultrasonic transmit frequency. Also provided herein, is a method of fabricating an ultrasonic array comprising cutting a piezoelectric layer with a laser, wherein the piezoelectric layer resonates at an ultrasonic transmit center frequency of about 30 MHz. Further provided herein, is a method of fabricating an ultrasonic array comprising cutting a piezoelectric layer with a laser, wherein said piezoelectric layer resonates at an ultrasonic transmit frequency of about and between 10-200 MHz, preferably about and between, 20-150 MHz, and more preferably about and between 25-100 MHz.

Also provided herein is a method of fabricating an ultrasonic array by cutting the piezoelectric layer with a laser so that the heat affected zone is minimized. Also discussed is a method of fabricating an ultrasonic array comprising cutting the piezoelectric layer with a laser so that re-poling (post laser micromachining) is not required.

Provided herein is a method wherein the "dicing" of all functional layers can be achieved in one or a series of consecutive steps. Further provided herein is a method of fabricating an ultrasonic array that includes cutting a piezoelectric layer with a laser so that the piezoelectric layer resonates at a high ultrasonic transmit frequency. In one example, the laser cuts additional layers other than the piezoelectric layer. In another example, the piezoelectric layer and the additional layers are cut at substantially the same time, or substantially simultaneously. Additional layers cut can include, but are not limited to, temporary protective layers, an acoustic lens 302, matching layers 116 and/or 126, backing layers 114, photoresist layers, conductive epoxies, adhesive layers, polymer layers, metal layers, electrode layers 110 and/or 112, and the like. Some or all of the layers can be cut through substantially simultaneously. Thus, a plurality of the layers can be selectively cut through substantially at the same time. Moreover, several layers can be selectively cut through at one time, and other layers can be selectively cut through at subsequent times, as would be clear to one skilled in the art.

Further provided is a method wherein a laser cuts first though at least a piezoelectric layer and second through a backing layer where both the top and bottom faces of the stack are exposed to air. The stack 100 can be attached to a mechanical support or interposer 402 that defines a hole or opening located below the area of the stack in order to retain access to the bottom surface of the stack. The interposer can also act as a redistribution layer for electrical leads to the individual elements of the array. In one example, after the laser cuts are made through the stack mounted onto the interposer, additional backing material can be deposited into the second opening defined by the interposer to increase the thickness of the backing layer.

Of course, the disclosed method is not limited to a single cut by the laser, and as would be clear to one skilled in the art, multiple additional cuts can be made by the laser, through one or more disclosed layers.

Further provided is a method of fabricating an ultrasonic array that includes cutting a piezoelectric layer with a laser so that the piezoelectric layer resonates at a high ultrasonic transmit frequency. In this embodiment, the laser cuts portions of the piezoelectric layer to different depths. The laser may, for example, cut to at least one depth, or several different depths. Each depth of laser cut can be considered as a separate region of the array structure. For example, one region can require the laser to cut through the matching layer, electrode layers, the piezoelectric layer and the backing layer, and a second region can require the laser to cut through the matching layer, the electrode layers, the piezoelectric layer, the dielectric layer 108, and the like.

In one aspect of the disclosed method, both the top and bottom surfaces of a pre-diced assembled stack are exposed and the laser machining can take place from either (or both) surface(s). In this example, having both surfaces exposed allows for cleaner and straighter kerf edges to be created by laser machining. Once the laser beam "punches through," then the beam can clean the edges of the cut since the machining process no longer relies on material being ejected out from the entry point and the interaction with the plume for the deepest part of the cut can be minimized.

Further provided is a method wherein the laser can also pattern other piezoelectric layers. In addition to PZT piezoelectric ceramic, ceramic polymer composite layers can be fabricated and lapped to similar thicknesses as described about using techniques known in the art such as, for example, by interdigitation methods. For example, 2-2 and 3-1 ceramic polymer composites can be made with a ceramic width and a ceramic-to-ceramic spacing on the order of the pitch required for an array. The polymer filler can be removed and element-to-element cross talk of the array can be reduced. The fluence required to remove a polymer material is lower than that required for ceramic, and therefore an excimer laser represents a suitable tool for the removal of the polymer in a polymer-ceramic composite to create an array structure with air kerfs. In this case, within the active area of the array (where the polymer is being removed), the 2-2 composite can be used as a 1-phase ceramic. Alternatively, one axis of connectivity of the polymer in a 3-1 composite can be removed.

Another approach for the 2-2 composite can be to laser micro machine the cuts perpendicular to the orientation of the 2-2 composite. The result can be a structure similar to the one created using the 3-1 composite since the array elements would be a ceramic/polymer composite. This approach can be machined with a higher fluence since both ceramic and polymer can be ablated at the same time.

The surface of the sample being laser ablated can be protected from debris being deposited on the sample during the laser process itself. In this example, a protective layer can be disposed on the top surface of the stack assembly. The protective layer may be temporary and can be removed after the laser processing. The protective layer may be a soluble layer such as, for example, a conventional resist layer. For example, when the top surface is a thin metal layer the protective layer acts to prevent the metal from peeling or flaking off. As one skilled in the art will appreciate, other soluble layers that can remain adhered to the sample despite the high laser fluence and the high density of laser cuts and that can still be removed from the surface after laser cutting can be used.

EXAMPLE

The following example is put forth so as to provide those of ordinary skill in the art with a complete disclosure and description of an ultrasonic array transducer and the methods as claimed herein, and is intended to be purely exemplary of the invention and are not intended to limit the scope of what the inventors regard as their invention.

An exemplary method for fabricating an exemplary high-frequency ultrasonic array using laser micromachining is shown in FIGS. 12*a*-12*g*. First, a pre-poled piezoelectric structure with an electrode on its top and bottom surfaces is provided. An exemplary structure is model PZT 3203HD (part number KSN6579C), distributed by CTS Communications Components Inc (Bloomingdale, Ill.). In one aspect, the electrode on the top surface of the piezoelectric becomes the ground electrode 110 of the array and the electrode on the bottom surface is removed and replaced with a dielectric layer 108. An electrode can be subsequently deposited onto the bottom surface of the piezoelectric, which becomes the signal electrode 112 of the array.

Optionally, a metalized layer of lower resistance (at 1-100 MHz) that does not oxidize is deposited by thin film deposition techniques such as sputtering, evaporation, electroplating, etc. A non-limiting example of such a metalized layer is a Cr/Au combination. If this layer is used, the Cr is used as an adhesion layer for the Au. Optionally, for ceramic piezolelectrics (such as PZT), the natural surface roughness of the structure form the manufacturer may be larger than desired. For improved accuracy/precision in achieving the piezoelectric layer 106 target thickness, the top surface of the piezoelectric structure may be lapped to a smooth finish and an electrode applied to the lapped surface.

Next, a first matching layer 116 is applied to top surface of the piezoelectric structure. In one aspect, part of the top electrode remains exposed to allow for the signal ground to be connected from the top electrode to the signal ground trace (or traces) on an underlying interposer 402. The matching layer is applied to the top surface of the piezoelectric structure, allowed to cure and is then lapped to the target thickness. One non-limiting example of a matching layer material used was PZT 30% mixed with 301-2 Epotek epoxy that had an acoustic impedance of about 8 Mrayl. In some examples a range of 7-9 Myral is desired for the first layer. In other examples, a range of 1-33 Mryal can be used. The powder loaded epoxy is prepared and cured onto the top face of the piezoelectric structure such that there are substantially no air pockets within the first matching layer. In one non-limiting example, the 301-2 epoxy was first degassed, the powder was mixed in, and the mixture was degassed a second time. The mixture is applied to the surface of the piezoelectric structure at a setpoint temperature that is elevated from room temperature. In this aspect, the matching layer has a desired acoustic impedance of 7-9 Mryal and target thickness of about ¼ wavelength which is about 20 μm thick for 30% PZT in 301-2 epoxy. Optionally, powders of different compositions and of appropriate (vol %) mixed with different epoxies of desired viscosity can be used to create the desired acoustic impedance.

Optionally, a metalized layer can be applied to the top of the lapped matching layer that connects to the top electrode of the piezoelectric structure. This additional metal layer serves as a redundant grounding layer that will help with electrical shielding.

The bottom surface of the piezoelectric structure is lapped to achieve the target thickness of the piezoelectric layer 106 suitable to create a device with the desired center frequency of operation when the stack is in its completed form. The desired thickness is dependent on the choice of layers of the stack, their material composition and the fabricated geometry and dimensions. The thickness of the piezoelectric layer is affected by the acoustic impedance of the other layers in the stack and by the width-to-height ratio of the array elements 120 that are defined by the combination of the pitch of the array and the kerf width of the array element kerfs 118 and of the sub-diced kerfs 122. For example, for a 30 MHz piezoelectric array with two matching layers and a backing layer the target thickness of piezoelectric layer was about 60 μm. In another example, the target thickness is about 50-70 μm. For frequencies in the range of 25-50 MHz the values are scaled accordingly based on the knowledge of the materials being used as would be known to one skilled in the art.

A dielectric layer 108 is applied to at least a portion of the bottom surface of the lapped piezoelectric layer. The applied dielectric layer defines an opening in the central region of the piezoelectric layer (underneath the area covered by the matching layer). One will appreciate, that the opening defined by the dielectric layer also defines the elevation dimension of the array. In one exemplified example, to form the dielectric layer, SU-8 resist formulations (MicroChem, Newton, Mass.) that are designed to be spin coated onto flat surfaces and represents are used. By controlling the spin speed, time of spinning and heating (all standard parameters known to the art of spin coating and thin film deposition) a uniform thickness can be achieved. SU-8 formulations are also photo-imageable and thus by means of standard photolithography, the dielectric layer is patterned and a gap of desired width and breath was etched out of the resist to form the opening in the dielectric layer. Optionally, a negative resist formulation is used such that the areas of the resist that are exposed to UV radiation are not removed during the etching process to create the opening of the dielectric layer (or any general pattern).

Adhesion of the dielectric layer to the bottom surface of the piezoelectric layer is enhanced by a post UV exposure. The additional UV exposure after the etching process improves the cross linking within the SU-8 layer and increases the adhesion and chemical resistance of the dielectric layer.

Optionally, a mechanical support can be used to prevent cracking of the stack 100 during the dielectric layer application process. In this aspect, the mechanical support is applied to the first matching layer by spinning an SU-8 layer onto the mechanical support itself. The mechanical support can be used during the deposition of the SU-8 dielectric, the spinning, the baking, the initial UV exposure and the development of the resist. In one aspect, the mechanical support is removed prior to the second UV exposure as the SU-8 layer acts as a support unto itself.

Next, a signal electrode layer 112 is applied to the lapped bottom surface of the piezoelectric layer and to the bottom surface of the dielectric layer. The signal electrode layer is wider than the opening defined by the dielectric layer and covers the edge of the patterned dielectric layer in the areas that overlie the conductive material used to surface mount the stack to the underlying interposer. The signal electrode layer is typically applied by a conventional physical deposition technique such as evaporation or sputtering, although other processes can be used such as electroplating. In another example, a conventional conformal coating technique such as sputtering is used in order to achieve good step coverage in the areas in the vicinity to the edge of the dielectric layer. In one example, the signal electrode layer covers the entire surface of the bottom face of the stack or forms a rectangular pattern centered across the opening defied by dielectric layer. The signal electrode layer is then patterned by means of a laser.

In one aspect, the original length of the signal electrode layer is longer than the final length of the signal electrode. The signal electrode is trimmed (or etched) into a more intricate pattern to form a shorter length. One will appreciate that a shadow mask or standard photolithographic process can be used to deposit a pattern of more intricate detail. Further, a laser or another material removal technique, such as reactive ion etching (RIE), for example, can also be used to remove some of the deposited signal electrode to create a similar intricate pattern.

In the region where there is no dielectric layer, the full potential of the electric signal applied to the signal electrode and the ground electrode exists across the piezoelectric layer. In the regions where there is a dielectric layer, the full potential of the electric signal is distributed across the thickness of the dielectric layer and the thickness of the piezoelectric layer.

Next, the stack is mounted onto a mechanical support such that upper surface of the first matching layer is bonded to the mechanical support and the bottom face of the stack is exposed. In one aspect, the mechanical support is larger in surface dimension than the stack. In another aspect, in the areas of the mechanical support that are still visible when viewed from the top (i.e., the perimeter of the support) there are markings that are used for alignment purposes during surface mounting of the stack onto an interposer. For example, the mechanical support can be, but is not limited to, an interposer. One example of such an interposer is a 64-element 74 μm pitch array (1.5 lambda at 30 MHz), part number GK3907_3A, which can be obtained from Gennum Corporation (Burlington, Ontario, Canada). When the mechanical support and the interposer are identical, the two edges of the opening defined by the dielectric layer can be oriented perpendicular to the metal traces on the support so that the stack can be properly oriented with respect to the metal traces on the interposer during a surface mounting step.

In one aspect, any (or all) external traces on the interposer are used as alignment markings. These markings allow for the determination of the orientation of the opening defined by the dielectric layer with respect to the markings on the mechanical support in both X-Y axes. In another aspect, the alignment markers on the mechanical support are placed on a portion of the surface of the stack itself. For example, alignment marks can be placed on the stack during the deposition of the ground electrode layer.

As noted above, an electrode pattern is created on the bottom surface of the signal electrode layer, which is located on the bottom face of the stack, and is patterned with a laser. The depth of the laser cut is deep enough to remove a portion of the electrode. One skilled in the art will appreciate that this laser micromachining process step is similar to the use of lasers to trim electrical traces on surface resistors and on circuit boards or flex circuits. In one aspect, using the markings on the perimeter of the mechanical support as a reference, the X-Y axes of the laser beam are defined with a known relation to the opening defined by the dielectric layer. The laser trimmed pattern is oriented in a manner such that the pattern can be superimposed on top of the metal trace pattern that is defined on the interposer. The Y axis alignment of the trimmed signal electrode pattern to the signal trace pattern of the interposer is important and in one aspect misalignment is no more that 1 full array element pitch.

A KrF excimer laser used in projection etch mode with a shadow mask can be used to create a desired electrode pattern. For example, a Lumonics (Farmington Hills, Mich.) EX-844, FWHM=20 ns can be used. In one aspect, a homogenous central part of the excimer laser beam cut out by using a rectangular aperture passes through a beam attenuator, double telescopic system and a thin metal mask, and imaged onto the surface of the specimen mounted on a computer controlled x-y-z stage with a 3-lens projection system ($\leqq$1.5 μm resolution) of 86.9 mm effective focal length. In one aspect, the reduction ratio of the mask projection system can be fixed to 10:1.

In one aspect, two sets of features are trimmed into the signal electrode on the stack. Leadfinger features are trimmed into the signal electrode on the stack to provide electrical continuity from the interposer to the active area of the piezoelectric layer defined by the opening defined by the dielectric layer. In the process of making these leadfingers, the final length of the signal electrode can be created. Narrow lines are also trimmed into the signal electrode on the stack to electrically isolate each leadfinger.

By mounting the stack onto a mechanical support interposer (of exact dimension and form as the actual interposer) and orienting the laser trimmed signal electrode pattern with respect to the externally visible metal pattern on the mechanical support allows the trimmed signal electrode pattern to be automatically aligned to the traces on the actual interposer. This makes surface mounting alignment simple with the use of a jig that aligns the edges of the two mechanical support interposer and actual interposer during surface mounting. After the surface mounting process is complete, the mechanical support interposer is removed. For the surface mounting process, materials 404 can be used that are known in the art, including, for example, low temperature perform Indium solder that can be obtained from Indium Corporation of America (Utica, N.Y.).

Next, backing material 114 is applied to the formed stack. If an epoxy based backing is used, and wherein some curing in-situ within the hole of the interposer takes place, the use of a rigid plate bonded to the top surface of the stack can be used to avoid warping of the stack. The plate can be removed once the curing of the backing layer is complete. In one aspect, a combination of backing material properties that includes a high acoustic attenuation, and a large enough thickness, is selected such that the backing layer behaves as close to a 100% absorbing material as possible. The backing layer does not cause electrical shorting between array elements.

The ground electrode of the stack is connected to the traces on the interposer reserved for ground connections. There are many exemplary conducting epoxies and paints that can be used to make this connection that are well known by someone skilled in the art. In one aspect, the traces from the interposer are connected to an even larger footprint circuit platform made from flex circuit or other PCB materials that allows for the integration of the array with an appropriate beamformer electronics necessary to operate the device in real time for generating a real time ultrasound image as would be known to one skilled in the art. These electrical connections can be made using several techniques known in the art such as solder, wirebonding, and anisotropic conductive films (ACF).

In one aspect, array elements 120 and sub-elements 124 can be formed by aligning a laser beam such that array kerf slots are oriented and aligned (in both X and Y) with respect to the bottom electrode pattern in the stack. Optionally, the laser cut kerfs extend into the underlying backing layer.

In one aspect, a lens 302 is positioned in substantial overlying registration with the top surface of the layer that is the uppermost layer of the stack. In another aspect, the minimum thickness of the lens substantially overlies the center of the opening defined by the dielectric layer. In a further aspect, the width of the curvature is greater than the opening defined by the dielectric layer. The length of the lens can be wider than the length of an underlying kerf slot allowing for all of the kerf slots to be protected and sealed once the lens is mounted on the top of the transducer device.

In one aspect, the bottom, flat face of the lens can be coated with an adhesive layer to provide for bonding the lens to the formed and cut stack. In one example, the adhesive layer can by a SU-8 photoresist layer that serves to bond the lens to the stack. One will appreciate that the applied adhesive layer can also act as a second matching layer 126 provided that the thickness of the adhesive layer applied to the bottom face of the lens is of an appropriate wavelength in thickness (such as, for example ¼ wavelength in thickness). The thickness of the exemplified SU-8 layer can be controlled by normal thin film deposition techniques (such as, for example, spin coating).

A film of SU-8 becomes sticky (tacky) when the temperature of the coating is raised to about 60-85° C. At temperatures higher than 85° C., the surface topology of the SU-8 layer may start to change. Therefore, in a preferred aspect, this process is performed at a set point temperature of 80° C. Since the SU-8 layer is already in solid form, and the elevated temperature only causes the layer to become tacky, then once the adhesive layer is attached to the stack, the applied SU-8 does not flow down the kerfs of the array. This maintains the physical gap and mechanical isolation between the formed array elements. To avoid trapping air in between the adhesive layer and the first matching layer, it is preferred that this bonding process take place in a partial vacuum. In one aspect, after the bonding has taken place, and the sample cooled to room temperature, a UV exposure of the SU-8 layer (through the attached lens) is used to cross link the SU-8, to make the layer more rigid, and to improve adhesion.

In another aspect, prior to mounting the lens onto the stack, the SU-8 layer and the lens can be laser cut, which effectively extends the array kerfs (first and/or second array kerf slots), and in one aspect, the sub-diced or second kerfs, through both matching layers (or if two matching layers are used) and into the lens.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only.

What is claimed is:

1. An ultrasonic transducer comprising:

a stack having a first face, an opposed second face and a longitudinal axis extending therebetween, wherein the stack comprises a plurality of layers, each layer having a top surface and an opposed bottom surface, wherein the plurality of layers of the stack comprises a piezoelectric layer and a dielectric layer; and a plurality of first kerf slots defined therein the stack, each first kerf slot extending a predetermined depth therein the stack and a first predetermined length in a direction substantially parallel to the axis, wherein the top surface of the dielectric layer is connected to and underlies a portion of the bottom surface of the piezoelectric layer and defines an opening extending a second predetermined length in a direction substantially parallel to the axis of the stack, and wherein the first predetermined length of each first kerf slot is at least as long as the second predetermined length of the opening defined by the dielectric layer and is shorter than the longitudinal distance between the first face and the opposed second face of the stack in a lengthwise direction substantially parallel to the axis.

2. The ultrasonic transducer of claim 1, wherein the plurality of first kerf slots define a plurality of ultrasonic array elements.

3. The ultrasonic transducer of claim 1, wherein the plurality of layers further comprises a signal electrode layer, wherein at least a portion of the top surface of the signal electrode layer is connected to at least a portion of the bottom surface of the piezoelectric layer, and wherein at least a portion of the top surface of the signal electrode layer is connected to at least a portion of the bottom surface of the dielectric layer.

4. The ultrasonic transducer of claim 3, wherein the plurality of layers further comprises a ground electrode layer, wherein at least a portion of the bottom surface of the ground electrode layer is connected to at least a portion of the top surface of the piezoelectric layer.

5. The ultrasonic transducer of claim 4, wherein the ground electrode layer is at least as long as the second predetermined length of the opening defined by the dielectric layer in a lengthwise direction substantially parallel to the axis.

6. The ultrasonic transducer of claim 5, wherein the ground electrode layer is at least as long as the first predetermined length of each first kerf slot in a lengthwise direction substantially parallel to the axis.

7. The ultrasonic transducer of claim 4, wherein the plurality of layers of the stack further comprises at least one matching layer, each matching layer having a top surface and an opposed bottom surface, and wherein the plurality of first kerf slots extends therethrough the at least one matching layer.

8. The ultrasonic transducer of claim 7, wherein the at least one matching layer comprises a first matching layer and a second matching layer, the second matching layer being connected to the first matching layer such that the second matching layer overlies the first matching layer.

9. The ultrasonic transducer of claim 8, wherein at least a portion of the bottom surface of the first matching layer is connected to at least a portion of the top surface of the piezoelectric layer.

10. The ultrasonic transducer of claim 7, wherein each matching layer of the at least one matching layer is at least as long as the second predetermined length of the opening defined by the dielectric layer in a lengthwise direction substantially parallel to the axis.

11. The ultrasonic transducer of claim 7, wherein the plurality of layers of the stack further comprises a backing layer, wherein at least a portion of the top surface of the backing layer is connected to at least a portion of the bottom surface of the dielectric layer.

12. The ultrasonic transducer of claim 11, wherein the backing layer substantially fills the opening defined by the dielectric layer.

13. The ultrasonic transducer of claim 11, wherein at least a portion of the top surface of the backing layer is connected to at least a portion of the bottom surface of the piezoelectric layer.

14. The ultrasonic transducer of claim 11, further comprising a lens, wherein the lens is positioned in substantial overlying registration with the top surface of the matching layer of the at least one matching layer.

15. The ultrasonic transducer of claim 14, wherein at least one first kerf slot extends into a bottom portion of the lens.

16. The ultrasonic transducer of claim 1, wherein at least a portion of at least one first kerf slot extends to a predetermined depth that is at least 60% of the distance from the top surface of the piezoelectric layer to the bottom surface of the piezoelectric layer.

17. The ultrasonic transducer of claim 11, wherein at least a portion of at least one first kerf slot extends therethrough the piezoelectric layer.

18. The ultrasonic transducer of claim 17, wherein at least a portion of at least one first kerf slot extends to a predetermined depth into the underlying dielectric layer.

19. The ultrasonic transducer of claim 18, wherein the at least a portion of one first kerf slot extends into the backing layer.

20. The ultrasonic transducer of claim 1, wherein the predetermined depth of at least a portion of at least one first kerf slot varies in a lengthwise direction substantially parallel to the axis.

21. The ultrasonic transducer of claim 1, wherein the predetermined depth of at least one first kerf slot is deeper than the predetermined depth of at least one other first kerf slot.

22. The ultrasonic transducer of claim 1, further comprising a plurality of second kerf slots, each second kerf slot extending a predetermined depth therein the stack and a third predetermined length in a direction substantially parallel to the axis, wherein the length of each second kerf slot is at least as long as the second predetermined length of the opening defined by the dielectric layer and is shorter than the longitudinal distance between the first face and the opposed second face of the stack in a lengthwise direction substantially parallel to the axis, and wherein each second kerf slot is positioned adjacent to at least one first kerf slot.

23. The ultrasonic transducer of claim 22, wherein the plurality of first kerf slots define a plurality of ultrasonic array elements and the plurality of second kerf slots define a plurality of ultrasonic array sub-elements.

24. The ultrasonic transducer of claim 23, wherein each of the plurality of the ultrasonic array sub-elements have an aspect ratio of width to height of about 0.5 to about 0.7.

25. The ultrasonic transducer of claim 22, wherein the ground electrode layer is at least as long as the first predetermined length of each first kerf slot and the third predetermined length of each second kerf slot in a lengthwise direction substantially parallel to the axis.

26. The ultrasonic transducer of claim 22, wherein at least a portion of at least one second kerf slot extends to a predetermined depth that is at least 60% of the distance from the top surface of the piezoelectric layer to the bottom surface of the piezoelectric layer.

27. The ultrasonic transducer of claim 11, further comprising a plurality of second kerf slots, each second kerf slot extending a predetermined depth therein the stack and a third predetermined length in a direction substantially parallel to the axis, wherein the length of each second kerf slot is at least as long as the second predetermined length of the opening defined by the dielectric layer and is shorter than the longitudinal distance between the first face and the opposed second face of the stack in a lengthwise direction substantially parallel to the axis, and wherein each second kerf slot is positioned adjacent to at least one first kerf slot.

28. The ultrasonic transducer of claim 27, wherein at least a portion of at least one second kerf slot extends therethrough the piezoelectric layer.

29. The ultrasonic transducer of claim 28, wherein the at least one second kerf slot extends into the underlying dielectric layer.

30. The ultrasonic transducer of claim 29, wherein the at least a portion of one second kerf slot extends into the backing layer.

31. The ultrasonic transducer of claim 22, wherein the predetermined depth of a second kerf slot varies in a lengthwise direction substantially parallel to the axis.

32. The ultrasonic transducer of claim 22, wherein the predetermined depth of at least one second kerf slot is deeper than the predetermined depth of at least one other second kerf slot.

33. The ultrasonic transducer of claim 4, further comprising an interposer having a top surface and an opposed bottom surface.

34. The ultrasonic transducer of claim 33, further comprising a plurality of electrical traces that are positioned on the top surface of the interposer in a predetermined pattern.

35. The ultrasonic transducer of claim 34, wherein the interposer defines a second opening extending a fourth predetermined length in a direction substantially parallel to the axis of the stack.

36. The ultrasonic transducer of claim 34, wherein the signal electrode layer defines an electrode pattern.

37. The ultrasonic transducer of claim 36, wherein the stack is mounted in substantial overlying registration with the interposer such that the electrode pattern defined by the signal electrode layer is electrically coupled with the predetermined pattern of electrical traces positioned on the top surface of the interposer.

38. An ultrasonic transducer comprising:

a stack having a first face, an opposed second face and a longitudinal axis extending therebetween, wherein the stack comprises a plurality of layers, each layer having a top surface and an opposed bottom surface; and a plurality of first kerf slots defined therein a portion of the stack, each first kerf slot extending a predetermined depth into the stack and extending a first predetermined length in a direction substantially parallel to the longitudinal axis, wherein the first predetermined length is less than the longitudinal distance between the first face and the opposed second face.

39. The ultrasonic transducer of claim 38, wherein the plurality of first kerf slots define a plurality of ultrasonic array elements.

40. The ultrasonic transducer of claim 38, wherein the plurality of layers comprises a piezoelectric layer and a dielectric layer.

41. The ultrasonic transducer of claim 40, wherein the piezoelectric layer is connected to the dielectric layer.

42. The ultrasonic transducer of claim 41, wherein the dielectric layer defines an opening extending a second predetermined length in a direction substantially parallel to the longitudinal axis of the stack, and wherein the first predetermined length of each first kerf slot is at least as long as the second predetermined length of the opening.

43. The ultrasonic transducer of claim 42, further comprising a plurality of second kerf slots, each second kerf slot extending a predetermined depth therein the stack and a third predetermined length in a direction substantially parallel to the axis, wherein the third predetermined length of each second kerf slot is at long as the second predetermined length of the opening defined by the dielectric layer and is shorter that the longitudinal distance between the first face and the opposed second face of the stack in a lengthwise direction substantially parallel to the axis and wherein one second kerf slot is positioned adjacent to at least one first kerf slot.

44. The ultrasonic transducer of claims 40, wherein the plurality of layers further comprises a ground electrode layer, a signal electrode layer, a backing layer, and at least one matching layer.

45. The ultrasonic transducer of claims 43, wherein the plurality of layers further comprises a ground electrode layer, a signal electrode layer, a backing layer, and at least one matching layer.

46. The ultrasonic transducer of claim 38, wherein at least one first kerf slot extends through at least one layer to reach its predetermined depth in the stack.

47. The ultrasonic transducer of claim 43, wherein at least on second kerf slot extends through at least one layer to reach its predetermined depth in the stack.

48. The ultrasonic transducer of claim 44, wherein at least a portion of one first kerf slot extends through at least one layer and extends to a predetermined depth into the backing layer.

49. The ultrasonic transducer of claim 38, wherein the predetermined depth of at least a portion of at least one first kerf slot varies in a lengthwise direction substantially parallel to the axis.

50. The ultrasonic transducer of claim 38, wherein the predetermined depth of at least one first kerf slot is deeper than the predetermined depth of at least one other kerf slot.

51. The ultrasonic transducer of claim 45, wherein at least a portion of one second kerf slot extends through at least one layer and extends to a predetermined depth into the backing layer.

52. The ultrasonic transducer of claim 46, wherein the predetermined depth of at least a portion of at least one second kerf slot varies in a lengthwise direction substantially parallel to the axis.

53. The ultrasonic transducer of claim 43, wherein the predetermined depth of at least one second kerf slot is deeper than the predetermined depth of at least one other kerf slot.

54. The ultrasonic transducer of claim 40, wherein at least a portion of at least one first kerf slot extends to a predetermined depth that is at least 60% of the distance from the top surface of the piezoelectric layer to the bottom surface of the piezoelectric layer.

55. The ultrasonic transducer of claim 40, wherein at least a portion of at least one first kerf slot extends therethrough the piezoelectric layer.

56. The ultrasonic transducer of claim 43, wherein at least a portion of at least one second kerf slot extends to a predetermined depth that is at least 60% of the distance from the top surface of the piezoelectric layer to the bottom surface of the piezoelectric layer.

57. The ultrasonic transducer of claim 43, wherein at least a portion of at least one second kerf slot extends therethrough the piezoelectric layer.

58. The ultrasonic transducer of claim 44, further comprising a lens, wherein the lens is positioned in substantial overlying registration with a top surface of the stack.

59. The ultrasonic transducer of claim 58, wherein at least one first kerf slot extends therein a bottom portion of the lens.

60. The ultrasonic transducer of claim 44, wherein at least a portion of the signal electrode layer underlies and is connected to the bottom surface of the piezoelectric layer and at least a portion of the signal electrode layer underlies and is connected to the bottom surface of the dielectric layer.

61. The ultrasonic transducer of claim 60, wherein the signal electrode defines an electrode pattern.

62. The ultrasonic transducer of claim 61, further comprising an interposer having a top surface with a plurality of electrical traces located thereon in a predetermined pattern and an opposed bottom surface, wherein the stack is mounted in substantial overlying registration with the interposer such that the electrode pattern defined by the signal electrode layer is electrically coupled with the predetermined pattern of electrical traces.

63. The ultrasonic transducer of claim 62, further comprising means for mounting the stack in substantial overlying registration with the interposer structure.

* * * * *